United States Patent [19]

Smith et al.

[11] Patent Number: 5,561,421
[45] Date of Patent: Oct. 1, 1996

[54] ACCESS METHOD DATA COMPRESSION WITH SYSTEM-BUILT GENERIC DICTIONARIES

[75] Inventors: Brian J. Smith, San Jose, Calif.; Mark A. Sovik, Tucson, Ariz.; Pong-Sheng Wang; Nancy Y. Young, both of San Jose, Calif.; Ahmad Zandi, Cupertino, Calif.

[73] Assignee: International Business Machines Corporation, Armonk, N.Y.

[21] Appl. No.: 281,717

[22] Filed: Jul. 28, 1994

[51] Int. Cl.$^6$ ................................................. H03M 7/30
[52] U.S. Cl. ............................................ 341/51; 341/106
[58] Field of Search ................................. 341/51, 63, 106

[56] References Cited

U.S. PATENT DOCUMENTS

| | | | |
|---|---|---|---|
| 4,626,829 | 12/1986 | Hauck | 341/63 |
| 4,843,389 | 6/1989 | Lisle et al. | 341/106 |
| 4,847,619 | 7/1989 | Kato et al. | 341/106 |
| 4,881,075 | 11/1989 | Weng | 341/87 |
| 4,988,998 | 1/1991 | O'Brien | 341/55 |
| 5,087,913 | 2/1992 | Eastman | 341/95 |
| 5,175,543 | 12/1992 | Lantz | 341/51 |
| 5,298,895 | 3/1994 | Van Maren | 341/51 |
| 5,408,234 | 4/1995 | Chu | 341/106 |
| 5,467,087 | 11/1995 | Chu | 341/51 |

*Primary Examiner*—Marc S. Hoff
*Attorney, Agent, or Firm*—Baker, Maxham, Jester & Meador

[57] ABSTRACT

A computer system constructs a compression dictionary for compressing a character string by interrogating an initial substring portion to determine input string characteristics that are used to select one or more dictionary segments from a library of predetermined dictionary segments individually adapted for compressing strings with particular characteristics. The initial substring portion is dynamically determined during the interrogation. A first set of dictionary segments that meet predetermined automatic selection criteria are selected and a second set of candidate dictionary segments that meet second-level selection criteria are identified for a sampling phase. During the sampling phase, the candidate dictionary segments are alternately used to compress the initial substring portion and determine compression performance statistics. The performance of the dictionary segments in the sampling phase determines which candidate dictionary segments will be added to the first selected dictionary segments, within dictionary total size limits. The first selected dictionary segments and the identified segments constitute a system-built compression dictionary that is used to compress the remainder of the input string. In this way, predetermined compression dictionaries are selected for maximum efficiency in accordance with the data actually being compressed and compression can be carried out quickly and efficiently as input data is received.

89 Claims, 8 Drawing Sheets

PRIOR ART

ACCESS METHOD DATA COMPRESSION WITH SYSTEM-BUILT GENERIC DICTIONARIES

BACKGROUND OF THE INVENTION

1. Field of the Invention

This invention relates generally to compression and decompression of data and, more particularly, to the construction of compression dictionaries for use with computer data compression and decompression systems.

2. Description of the Related Art

Data compression refers to transforming a set of data characters from an original state to a compressed state in which the data is represented by a reduced number of characters. More particularly, a string of characters in the original data is replaced with a reduced number of compression symbols in the compressed data. The original string of characters can include, for example, letters, numerals, punctuation marks, spaces or blanks, and special characters. The compressed data can be decompressed to restore the data back to the original state by replacing the compression symbols with the original substrings. Data compression has particular utility in computer systems because it can significantly reduce the storage requirements of large databases, thereby reducing the cost of data processing. For example, databases with large amounts of textual data such as names, locations, job titles, and the like or databases with large amounts of numerical data such as account statements are especially suited to compression techniques.

Computer-implemented data compression is carried out in systems that are typically characterized as providing either hardware compression or software compression. Hardware compression generally refers to compression and decompression that take place at a hardware storage device interface and are implemented by a dedicated hardware processor, such as one or more integrated circuit chips mounted on a circuit board. Generally, the hardware compression can be implemented by processors located at each end of a communications channel so that compression and decompression can take place as data is stored or retrieved. For example, data may be compressed as it is processed for storage on a magnetic disk and may be decompressed as it is retrieved from the disk. Software compression generally refers to data compression that occurs over an entire data set already stored in a storage device. That is, a software compression process is called by a controlling process and receives a block of data to be compressed, performs the data compression, and returns the compressed data to the controlling process. Software compression in a computer facility is generally implemented by software processes that are part of the system installation.

The configuration of a computer data compression system is the result of a trade-off between the reduction in storage space required for compressed data and the computational effort required to compress and decompress the data. The reduction in storage space is generally measured in terms of compression ratio, which relates the number of original symbols or characters, also called the data input size, to the number and length of the compressed symbols, also called the output size.

Computer data compression systems can carry out data compression by scanning an input string of characters to be compressed with a string table, also called a compression dictionary, to generate a string of compression symbols. More particularly, the dictionary is used to parse the input string so that substrings of the input characters are replaced with the dictionary symbols to which they are matched. In this way, long runs of characters or recurring word patterns should be replaced with reduced-length symbols, thereby resulting in data compression. Data decompression is easily carried out using a reverse process to match compression symbols with corresponding original input strings. Dictionaries that provide very efficient compression can be formed by software compression techniques in which the input data to be compressed is analyzed and then the dictionary is created as a result of character occurrence information obtained from the analysis. Alternatively, relatively fast hardware compression can be carried out by selecting a dictionary that was previously created based on the data anticipated to be received in the data channel and using the predetermined dictionary in the compression process.

A compression process can parse a data string, or split it into phrases for dictionary coding. For example, consider the case where a predetermined compression dictionary contains the parsing alphabet M, where $M=\{a, b, ba, bb, abb\}$ and the dictionary alphabet is mapped to compression output symbols C, where $C(a)=00, C(b)=010, C(ba)=0110, C(bb)=0111,$ and $C(abb)=1.$ Next, consider the data string "babb". If each character of the data string b, a, and so forth requires eight bits for representation, then the uncompressed data string having four characters requires thirty-two bits to be stored in memory. In contrast, using the compression dictionary M, the data string would be encoded as $C(ba).C(bb)=0110.0111$ or, ideally, as $C(b).C(abb)=010.1$. In any case, it can be seen that there is a net reduction in bits necessary to store the data string.

Many data compression systems are based on techniques first described by J. Ziv and A. Lempel in 1977. See, for example, U.S. Pat. No. 4,464,650 to Eastman et al. for Apparatus and Method for Compressing Data Signals and Restoring the Compressed Data Signals, issued Aug. 7, 1984. In accordance with the Ziv-Lempel techniques (also referred to by the abbreviation L-Z), an input string of characters to be compressed is scanned such that repeated sequences of characters are replaced with pointers to earlier occurrences of the sequence in the input string.

For example, one form of pointer is an ordered pair (m, n) where m represents the longest matching previously seen phrase in the input string and n represents the next character in the input string. Each input phrase is encoded as an index to the previously seen phrase (a phrase prefix) followed by the next character. The new phrase is then added to the list of phrases that may be referenced, comprising a dictionary. The encoded phrases thereby represent the output of the L-Z process. Thus, the data string "aaabbabaabaaabab" would be parsed into seven phrases as follows: a, aa, b, ba, baa, baaa, and bab. Each of the parsed phrases comprises a previously seen phrase followed by the next character. The phrases would be encoded as a pointer to the previously seen phrase, followed by the character. Thus, the first phrase would be encoded as (0, a), meaning no previously seen phrase, followed by the character "a". The "a" is therefore added to the phrases to be referenced. The second phrase, "aa", would be encoded as (1, a), meaning the first phrase "a" followed by the character "a". The third phrase "b" would be encoded as (0, b). The fourth phrase, "ba", would be encoded as (3, a), meaning the third phrase "b" followed by "a". The fifth phrase (baa) would be the fourth phrase (ba) followed by "a" and therefore would be encoded as (4, a). The sixth phrase would be encoded as "baaa"=(5, a) and, finally, the seventh phrase would be encoded as (bab)=(4, b). The encoded output string would therefore appear as (0, a), (1, a), (0, b), (3, a), (4, a), (5, a), (4, b). It should be readily apparent that the output string can be easily decoded to reproduce the original data string.

As known to those skilled in the art, the encoding described above can be implemented by inserting each parsed phrase into what is referred to as a trie data structure. A trie data structure is a tree where each phrase defines a path that begins at a root (the prefix) and ends at a node, which is then associated with that phrase. Each node of the trie structure contains the number of the phrase it represents. For example, FIG. 1 shows the data structure generated while parsing the string described in the previous paragraph. As shown in the drawing, the last phrase to be inserted was "bab", which identified the fourth node as the longest previous match and caused the creation of the seventh node with the additional "b" character. It should be noted that tracing the path from node 0 to node 7 produces the "bab" phrase that was encoded.

The input string for an L-Z process is scanned according to a scanning window of predetermined character length. Initially encountered substrings are added to a dictionary/ compressed data table. Thus, an L-Z dictionary changes with the encoding of input substrings to earlier occurrences and includes a list of previously parsed input strings. In this way, the dictionary can grow as the compression process is completed and can adapt somewhat to the input string being compressed. Some limitation must be placed on the growth of the dictionary in an L-Z process because larger dictionaries require larger output symbol sizes, and this may result in less efficient compression rather than the improved compression one might expect from having more dictionary entries to choose from. For example, U.S. Pat. No. 5,151, 697 to Bunton for Data Structure Management Tagging System issued Sep. 29, 1992 describes a method of controlling dictionary size and growth. The performance of L-Z systems is dictated by the size of the scanning window over which substrings are compared to earlier occurrences of substrings, to the substring pointer, and the dictionary construction criteria.

Those skilled in the art will appreciate that data compression with predetermined dictionaries can be relatively fast as compared with L-Z techniques, due largely to the computational effort required by L-Z techniques in building and scanning a parsing tree structure. Generally speaking, L-Z techniques operate more quickly when decoding, or decompressing data, than they do when encoding, or compressing data. In addition, predetermined dictionaries are of a known size in terms of the memory needed for storage. As noted above, L-Z techniques can require excessive storage for the dictionary as it is built and grows during encoding. Those skilled in the art, however, will appreciate that different predetermined compression dictionaries will provide very different compression ratios depending on the match between dictionary entries and input substrings. On the other hand, L-Z techniques provide a process that can adapt to the actual data being compressed.

Some computer systems that support software data compression provide a compression processor and permit a calling routine to specify a predetermined compression dictionary based on a user estimate of the type of data contained in the input string. This permits relatively fast encoding with minimal computational overhead. The compression dictionary is selected from a reservoir or library of generic dictionaries that are adapted to compress a variety of data. Unfortunately, designation of predetermined dictionaries that are not particularly suited to the input string that is received can have negative consequences on the data compression process and result in a minimally compressed data set.

From the discussion above, it should be apparent that there is a need for a method and computer system that permit effective selection of compression dictionaries from among a set of predetermined dictionaries and also permit the encoding process to adapt to the data actually being compressed, thereby permitting data compression to occur quickly and efficiently without needing excessive storage space for compression dictionaries. The present invention satisfies this need.

SUMMARY OF THE INVENTION

In accordance with the invention, an input string of characters to be compressed is interrogated over an initial substring block to determine input string data characteristics that are then used to select one or more dictionary segments from a library of dictionary segments individually adapted for compressing strings with particular characteristics. A first set of dictionary segments that meet automatic selection criteria are selected and a second set of candidate dictionary segments that meet sampling criteria are designated for a sampling phase. During the sampling phase, the candidate dictionary segments are alternately used to compress a sample substring block of the input string and produce compression performance statistics. The performance statistics of the candidate dictionary segments from the sampling phase determine which of those candidate dictionary segments will be added to the first selected dictionary segments, within dictionary total size limits. The first selected dictionary segments and the candidate segments selected with sampling constitute a system-built compression dictionary that is used to compress the remainder of the input string as it is received. In this way, a system-built compression dictionary comprising a set of predetermined dictionary segments is constructed for maximum compression efficiency in accordance with the data actually being compressed and compression can be carried out quickly and efficiently as the input string is received, or produced.

In one aspect of the invention, the interrogation data characteristic statistics collected over the initial substring include character frequency data and are used to determine if the subsequent data is suitable for compression and, if so, to select dictionary segments that are best suited to compress strings of the high-frequency characters. The interrogation statistics also can be used to determine if the sampling phase is necessary, what the size of the completed dictionary should be, and what the size of the interrogated substring should be. If desired, the interrogation statistics and the sampling performance statistics can be saved for later comparison against subsequent substrings to determine if different dictionary segments should be used or sampling should be resumed.

In another aspect of the invention, each one of the dictionary segments can be represented by a dictionary identifier so the resulting system-built compression dictionary can be stored as a dictionary token, comprising a string of one or more dictionary identifiers, and can be stored in system data catalogs referencing the compressed data. In this way, the system-built dictionary can be "tokenized" at the same time the compressed data is stored in external storage devices. When a compressed data string is to be accessed, or opened and decompressed, the tokenized dictionary associated with the string can be retrieved and expanded, or built, by matching the dictionary token with the dictionary identifiers and the corresponding dictionary segments stored in system memory. Decompression can then take place. Automatically storing the dictionary token along with the compressed string reduces the amount of storage space necessary for the string and its associated compression dictionary, provides improved portability of the string to any computer facility supporting the dictionary tokens, and permits the system-built dictionary to be easily shared with other similar strings.

Other features and advantages of the present invention should be apparent from the following description of the preferred embodiment, which illustrates, by way of example, the principles of the invention.

DESCRIPTION OF THE PREFERRED EMBODIMENT

Figure 2:
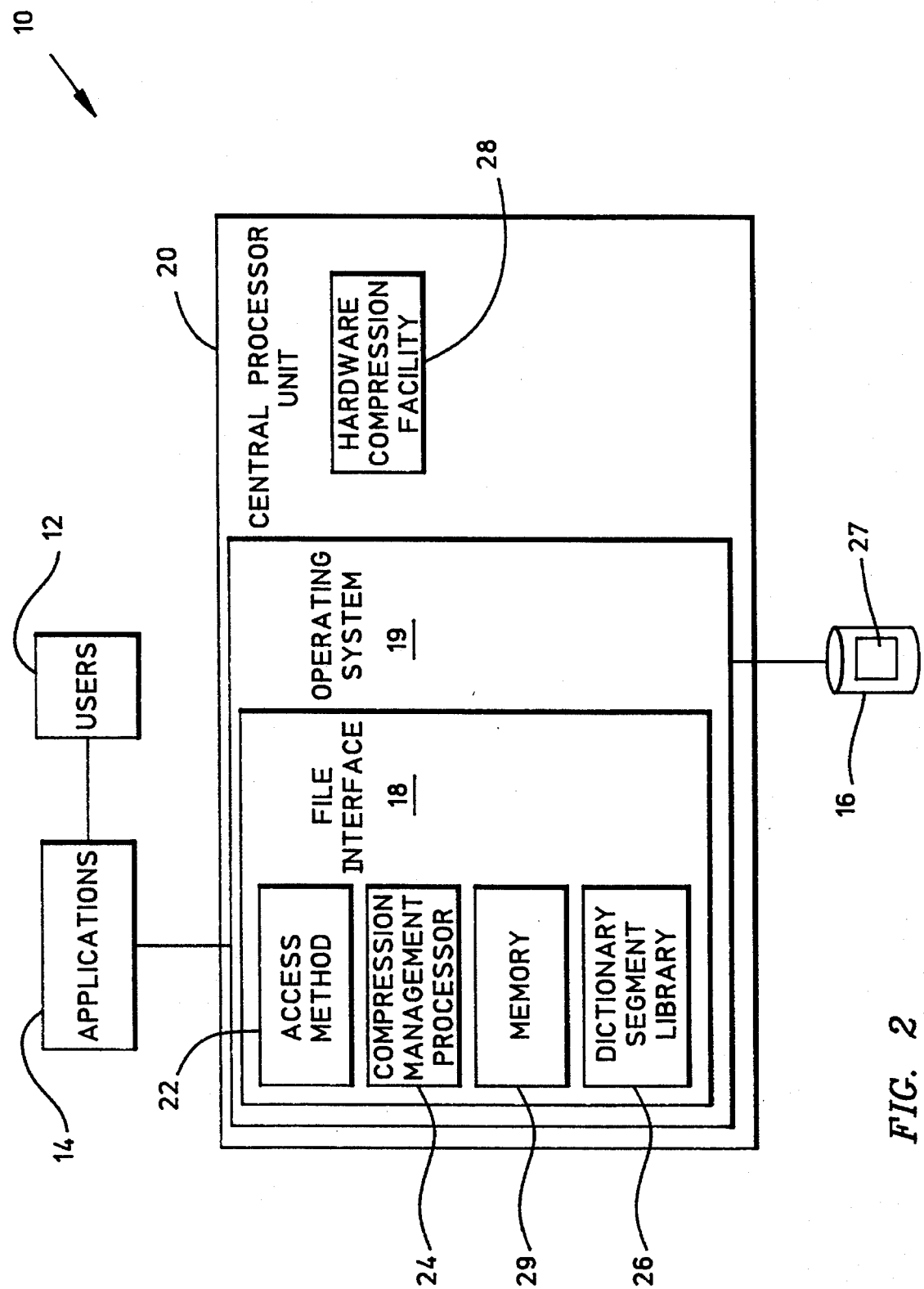
FIG. 2 is a block diagram of a computing facility that provides data compression and decompression in accordance with the present invention.

In FIG. 2, a computer system 10 constructed in accordance with the present invention supports one or more system users 12 who use applications 14 to produce new data that is stored into, and to retrieve old data from, a variety of external storage devices 16. The applications gain access to the storage devices through a file system interface 18 of an operating system 19 that controls a central processor unit (CPU) 20. The interface includes an access method processor 22 that initiates data compression upon the receipt of new input data and a request for compression from an application. In accordance with the invention, the interface further includes a compression management processor 24 that performs data interrogation and sampling on a substring of the input data to select one or more dictionary segments from a compression dictionary library 26 and to construct a system-built dictionary that can be used for data compression. The remainder of the input data received by the interface 18 other than the substring is compressed using the system-built dictionary. This system-built dictionary is "tokenized" and recorded in a system-managed data catalog 27 and is associated with the data set to be compressed.

In the preferred embodiment, the computer system 10 comprises a relatively large computer network of user terminals 12 connected to the CPU 20, which comprises what is commonly referred to as a mainframe, such as an International Business Machines (IBM) Corporation "System 390" central processor or the like. Alternatively, the CPU can comprise a wide variety of processors typically used to maintain large databases containing data in need of compression. The users 12 can comprise computer terminals such as IBM Corporation "AS/400" terminals or "PS/2" terminals. It should be understood, however, that the invention has equal utility when applied to a wide variety of system configurations and capabilities.

Figure 1:
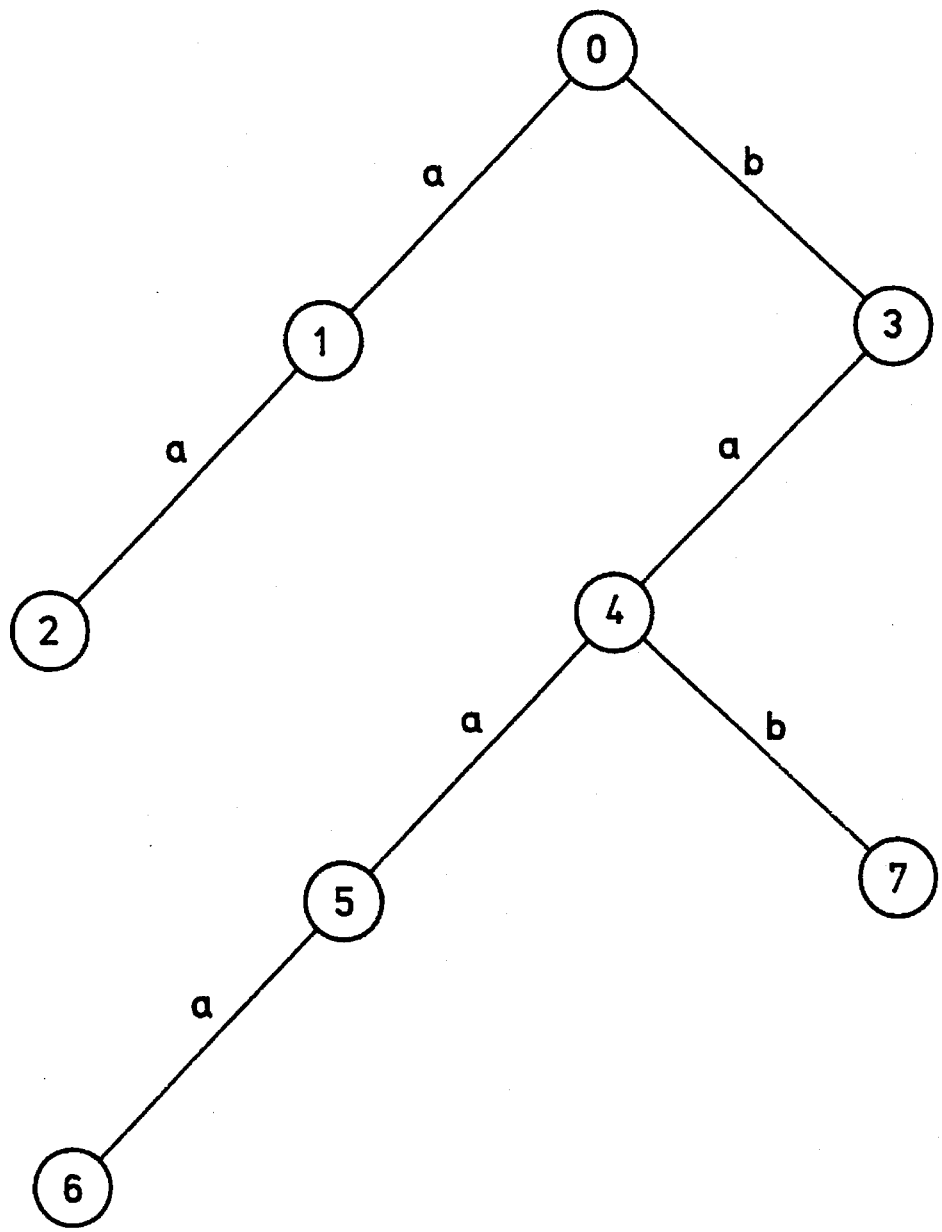
FIG. 1 is a representation of a Ziv-Lempel data structure known in the prior art.

The applications 14 generally comprise applications programs that execute according to the operating system 19 supported by the CPU 20. The applications programs advantageously require no modification to work with and benefit from the compression scheme of the present invention. In a relatively large mainframe environment such as illustrated in FIG. 1, for example, the operating system 19 can comprise the "MVS" system by the IBM Corporation. The access method processor 22 can comprise the IBM Corporation "VSAM", "IMS", or "DB2" application processes supported by the "MVS" operating system. The CPU includes a data compression device 28, such as the processor referred to as a Hardware Compression Facility (HCF) supported by the IBM Corporation "MVS" system. Alternatively, the data compression device can be a software compression process of the CPU 20 that receives the computer data storage locations of the data to be compressed, performs the compression, and returns a block of memory locations containing the compressed data, or can be a hybrid compression process.

The access method 22 controls the flow of data between the applications 14 and the external data storage 16. When the access method receives a request to compress data, it provides the compression management processor 24 with the data to be compressed, a compression dictionary token, and an output address destination for the compressed data. The compression management processor will construct a compression dictionary in memory 29 of the CPU 20 if necessary and will call the HCF 28, passing to the HCF the address of the data to be compressed, the address of the compression dictionary to be used in the compression process, and an output address of the area to contain the compressed data. The HCF then compresses the data using the compression dictionary and stores the compressed data in the designated output area. The compression dictionary and resulting compressed data can be temporarily stored in the system memory 29. The access method 22 then stores the compressed data on the external storage 16, and places information related to the compressed data in a data catalog portion 27 of the external storage. The external storage devices 16 may comprise a variety of external devices, such as magnetic disk drives or tape drive systems. If the access method receives data without a request for compression, it simply stores the data in the external storage as it is received.

The dictionary library 26 includes system-provided dictionary segments produced by the supplier of the operating system 19 or HCF 28. The dictionary segments typically are constructed as L-Z tree structures in a manner well-known to those skilled in the art or are collections of data suitable as the basis for constructing such tree structures. The library can include one or more user-defined dictionary segments. These segments can be tailored by users for the particular data being produced with the applications 14 in the circumstance that a user-defined dictionary segment provides improved compression performance when compared to the segments otherwise provided by the supplier library. Those skilled in the art will readily appreciate the manner in which such tailored dictionary segments can be produced.

Figure 3:
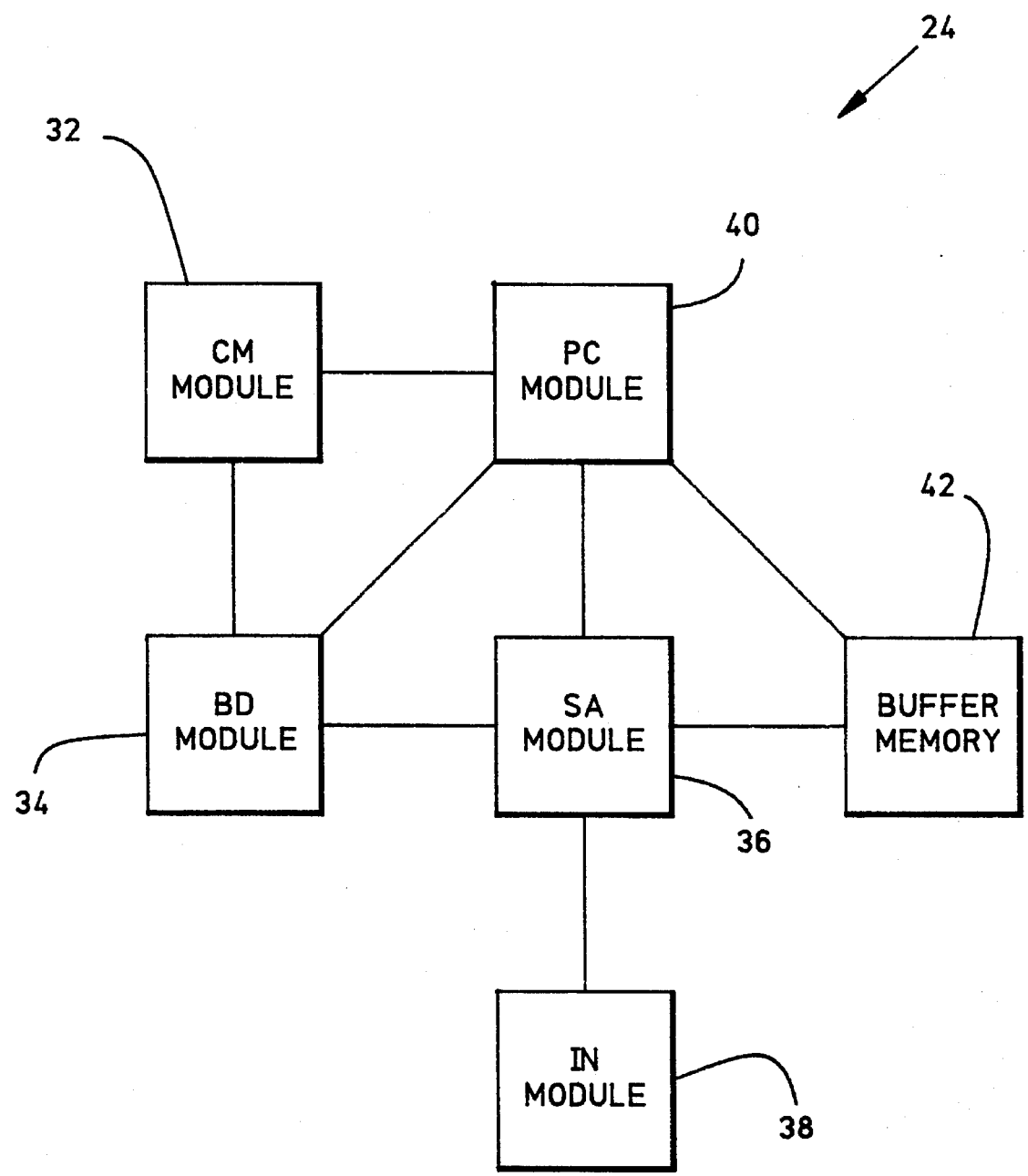
FIG. 3 is a block diagram of the compression management processor illustrated in FIG. 2.

FIG. 3 shows that the compression management processor 24 includes a "CM" compression module 32 that receives requests for data compression from the access method. The processor also includes a "BD" build dictionary module 34 that builds a fully expanded system-built dictionary based on a dictionary token comprising a string of dictionary identifiers, an "SA" sampling module 36 that initiates data interrogation and data sampling, an "IN" interrogation module 38 that carries out data sampling for the SA module, and a "PC" control module 40 that provides control over access to the build dictionary/data compression process. The PC module is called by the CM module when compression is requested by a user. Finally, the processor includes a data buffer memory 42 in which interrogation input strings and sampling strings are temporarily stored. Also stored in the buffer are interrogation data characteristic statistics and sampling performance statistics that result from the interrogation phase and sampling phase, respectively. The buffer can comprise a portion of the system memory 29.

Figure 4:
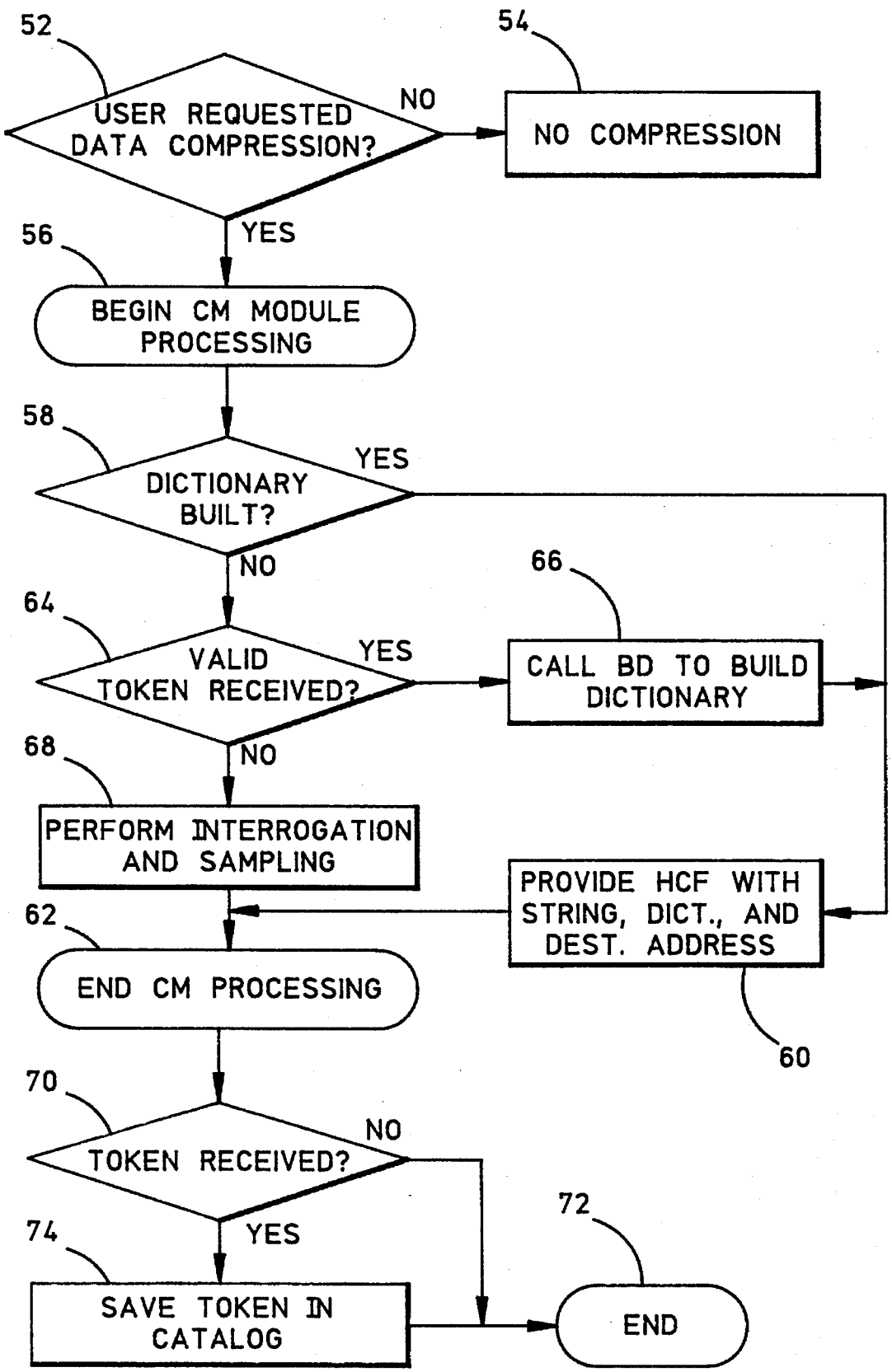
FIG. 4 is a flow diagram representing the processing steps followed by the computing facility illustrated in FIG. 2 in response to a request for data compression.

The flow diagram of FIG. 4 illustrates the processing steps followed by the compression management processor 24 and its constituent modules. Initially, the access method processor detects when a user application requests compression of a block of data (flow diagram box 52). If no compression is requested, a negative outcome at box 52, then the processor continues to operate conventionally with no compression, as indicated at the next flow diagram box 54. If compression is requested, then CM module processing begins, as represented by the box numbered 56. To perform compression, the access method calls the compression management processor 24 (FIG. 2), passing it the token representing the dictionary that is to be used to process this data set. If a data file of like compression characteristics is being accessed, the compression dictionary represented by the received token might already have been built, and therefore at the decision box numbered 58, the control module checks to determine if a system-built compression dictionary associated with the data file has been built. A system-built dictionary being built refers to a dictionary that is in a fully expanded format rather than in the "tokenized" format described further below.

If a system-built dictionary has been built, then at the flow diagram box numbered 60 the input string, dictionary, and destination address are provided to the Hardware Compression Facility 28 (FIG. 2). Compression processing is then completed at box 62 and the compression results are returned to the requesting user 52. If a system-built dictionary has not been built, a negative response at the decision box numbered 58, then at the decision box numbered 64 the compression management processor checks to determine if the provided token was a valid compression token. If a valid token was received and a dictionary was not built, then at the flow diagram box numbered 66 the BD module is called to build a system-built dictionary in accordance with the received dictionary token. Passing control through the PC module in this way permits security key switch control to take place.

If a valid system-built dictionary token was not received at box 64, then at box 68 the compression management processor 24 performs interrogation and sampling, as described further below, through calls to the IN and SA modules. After such operations, including the selection of dictionary segments, the CM processing ends at box 62. Various aspects of the processing illustrated in FIG. 4 will be described next in greater detail. At box 70, the access method processor checks to determine if a token was received from the CM processing steps. If no token was received, then the processing ends at box 72. If a token was received, then at box 74 the token is saved in the catalog before the processing ends at box 72.

As noted above, the system 10 responds to a request for constructing a system-built compression dictionary with a dictionary segment selection process. The dictionary selection process comprises selecting dictionary segments that have compression characteristics most like the data being received. In accordance with the invention, the characteristics of the data being received are determined by interrogating a substring and determining character attributes and computing statistics over the substring. In the preferred embodiment, the statistics computed by the interrogation module are called zero-order statistics, which comprise primarily character counts of the data set. Also included in the statistics are frequency counts for character groups and entropy statistics, as described further below. Higher order statistics also could be collected, if desired. In the preferred embodiment, the portion of the input string to be used in collecting the interrogation statistics is dynamically determined based on the stability of the statistics. Thus, it is not necessary to collect interrogation data characteristic statistics over the entire input string being compressed. This permits processing to be faster and to permit compression to occur in real time as data is received, or produced.

The dictionary selection process is invoked during the initial write operations of a data set. That is, the selection process is started when a data set is first provided to an access method for writing onto a data storage device. The process is continued until the data characteristic statistics have stabilized and a first set of "must have" dictionary segments is selected and no sampling is indicated as necessary, or "must have" dictionary segments have been selected and a set of sampling dictionary segment candidates have been identified for subsequent sampling and possible addition, or until a predetermined amount of input data has been interrogated, "must have" segments selected, and sampling candidate dictionary segments (if identified) have been added to the "must have" segments previously selected, or the data set is indicated as unsuitable for compression.

Figure 5:
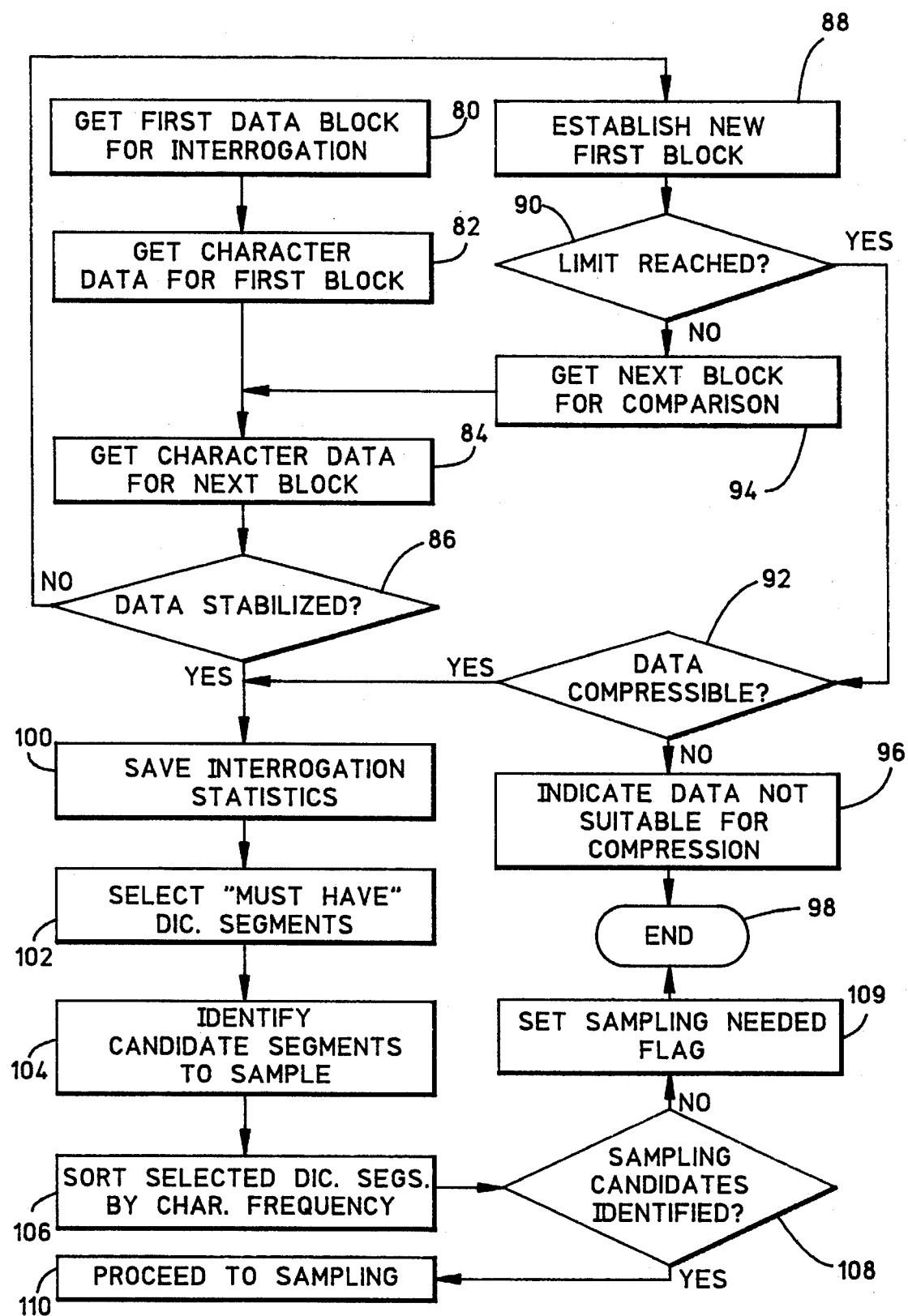
FIG. 5 is a flow diagram representing the processing steps performed by the IN module illustrated in FIG. 3.

The interrogation process is illustrated in the flow diagram of FIG. 5, which illustrates the processing steps followed by the IN module. To determine the portion of the input string on which dictionary selection will be based, an initial, first fixed-length block of the input string is placed in the data buffer 42 (FIG. 3), as represented by the flow diagram box numbered 80. Alternatively, the first fixed-length block can be specified in terms of the storage locations in which it resides, such as by a starting address and an ending address. Preferably, a starting portion of the input string is excluded from the interrogation process to ensure that standard header information, control characters, or other non-repeating symbols that might be expected to appear in the early portion of a data set do not influence the selection of dictionary segments. In this way, the interrogation block more accurately reflects the nature of the data to be compressed. The next step at the box numbered 82 is to scan the input interrogation string stored in the buffer, counting the characters of which it is comprised, and compute the desired data characteristic statistics relating to the interrogation string. A next block of input string characters (equal in size to the first block) also is placed in the buffer and corresponding interrogation statistics are calculated at the flow diagram box numbered 84.

As noted above, the interrogation data characteristic statistics include a raw count of character occurrences over the set of possible characters contained in the input string as well as counts of character groups to which the characters belong. In the interrogation phase, the character occurrence count and character group count preferably are collected according to a standard character set, such as the well-known ASCII character display code or the IBM Corporation 256-character EBCDIC code. For example, the EBCDIC set can be divided into character groups comprising upper case alphabetic characters, lower case alphabetic characters, numeric characters, special print characters, low control characters, and other remaining control characters. The first three groups are self-explanatory. The special print group includes characters such as @, %, &, *, and the like.. The low control characters include the NULL character having a representation of X'00' (by convention, such a notation indicates a hexadecimal byte string of all zeroes) and other low-order byte strings. The set of other control characters includes all other characters including, for example, the hexadecimal numbers represented by the high-order hexadecimal byte strings X'FA' through X'FF'.

In the preferred embodiment, the character occurrence counts are convened into relative frequency data and the interrogation summary statistics include the well-known entropy function that indicates suitability for data compression. The entropy function is defined by:

$$E = -\frac{1}{8} \Sigma p_i \log p_i,$$

where E is the entropy value, $p_i$ is the relative frequency of the ith character, and the log is to the base two. The range of the summation index i covers the number of characters in the character set. Thus, in the case of the 256-character IBM Corporation EBCDIC set, the index i runs from 1 to 256. The entropy function has an upper bound of 1.0 and a smaller entropy value indicates a greater suitability for compression.

The next step illustrated in FIG. 5 at the box numbered 86 is to check for stability of the statistics. In the preferred embodiment, this comprises comparing the previously computed character statistics on the first block in the buffer with the character statistics on the combination of the first block and the next (equal-sized) block. It should be appreciated that, alternatively, the statistics on the first block alone could be compared with the statistics on the next block alone. In either case, if the new statistics are within a variance threshold of the prior statistics, then stability is achieved and the interrogation process completes with the block corresponding to the new statistics as the selected interrogation block. That is, if the statistics on the first block are compared with the statistics on the combination of the first block and the next block, then the selected interrogation block comprises the combination of the first block and the next block.

If the statistical variance is greater than the threshold value, then at the flow diagram box numbered 88 a new first block for comparison is selected. At the flow diagram box numbered 90, a predetermined interrogation limit described below is checked. If the limit has been reached, then the data is checked to determine if it is compressible at the decision box numbered 92. The interrogation process otherwise continues at box 94 with the new next block for comparison. The character interrogation statistics are once again collected (box 84) and compared (box 86).

In the preferred embodiment, the selection of the new first block at the flow diagram box numbered 88 and the selection of the next block for comparison at the flow diagram box numbered 94 entail selecting increasingly large blocks for statistical collection and comparison. In particular, the interrogation statistics are first determined over the initial 4K bytes of the input string and are compared with the statistics over the combination of the first and second 4K bytes of the input string. If the character count information is within a predetermined difference threshold, an affirmative response at the decision box 86, then stability is indicated and the interrogation process is halted with the first 8K bytes (the first block plus the next block) selected as the interrogation block. If the character count information is not within the difference threshold, then the block of input string from the first two 4K bytes is added together to establish the new first block (box 88) and compared with the character count information over the combination of the first 8K plus the next 8K bytes of input data (box 94 followed by box 84 and box 86).

In the comparison, if the statistics over the first 8K bytes are within the difference threshold of the statistics over the combination of the first and second 8K bytes (box 86), then the interrogation process is halted with the first 16K bytes as the interrogation block. The character count information from the first two 8K bytes of data otherwise is added together to form the new first block and compared with the next block character count information from the next block comprising the combination of the first 16K bytes and the next 16K bytes of input data. The process is repeated in this fashion until the first 32K bytes of input data is compared with the combination of the first and second 32K bytes of data, at which point the interrogation process is halted either because the difference threshold is satisfied, or the collected statistics indicate compression processing should continue with dictionary selection, or the data set is indicated as being unsuitable for compression. Thus, the interrogation block is not permitted to be larger then 64K bytes. It should be understood that the 64K limit is an arbitrarily selected size limit and that other sizes can be selected. For example, under some circumstances, larger data sizes might be desirable and would be an option.

As described above, during interrogation, if the limit of interrogation block sizes is reached, an affirmative response at the decision block numbered 90, processing proceeds to the decision box numbered 92, where a check is made to determine if the data block indicates the data is compressible. This step involves calculating the entropy value and comparing the entropy value against a predetermined limit value. If the comparison indicates that the calculated entropy value is greater than the limit, then at the box numbered 96 the system indicates that the data is not compressible, such as through a message delivered to an output device. The interrogation process then ends at the box numbered 98. If desired, the system can proceed after the end step with conventional data storage, without compression, as indicated in FIG. 4. If the entropy value comparison indicates the data is compressible, then stabilization is achieved and the interrogation process ends. Processing proceeds to the next sequence.

The next step in FIG. 5 after data stabilization is to save the interrogation statistics for later recall, as indicated at box 100. Next, at box 102, is the selection of dictionary segments from the dictionary library in accordance with the interrogation statistics. The selection can be based on the statistics because the dictionary library contains generic dictionary segments that are particularly suited to compress strings of particular characters. In the preferred embodiment, the dictionary segments in the library are constructed such that they are particularly effective at compressing data from one of the character groups described above. For purposes of explanation, the dictionary segments can be classified into four types of segments: run suppressors, numeric, alphabetical, and permutation control.

The run suppressor dictionary segments are adapted to replace strings of identical characters with a compression symbol. The run suppressor dictionary segments can include, for example, suppressors for strings of the EBCDIC characters up to twenty bytes long. That is, the run suppressor dictionary segments will replace strings of up to twenty EBCDIC characters with a single dictionary symbol. Also included in the run suppressor group of dictionary segments are suppressors for the most commonly used string characters of greater than length twenty and the most commonly used control characters of greater than length twenty. These can be effective, for example, in compressing strings of blanks (spaces). Some of the numeric dictionary segments are directed to compressing all numeric variations of 00–99 and others are directed to compressing all numeric variations of 000–999. The particular function of the various dictionary segments will be explained in greater detail below in conjunction with a pseudocode listing. The alphabetical dictionary segments can be directed to compressing English words, word prefixes, word suffixes, the most common two-character sequences, and the most common three-character sequences. The permutation control dictionary segments are directed to compressing all possible numeric character strings to a length of six and compressing the most common control characters with a null to a length of six.

The selection of dictionary segments comprises different selection criteria depending on the type of dictionary segment being selected. For example, run suppressor dictionary segments might be selected according to the three most frequent characters among all characters in the interrogation string and the two most frequent characters among all characters within each of the groups defined above. The most popular characters (or character strings) within a group warrant a corresponding dictionary segment, even though such characters might not be so popular over the entire interrogation string, because a high within-group popularity indicates character strings that occur with sufficient frequency that the segment would contribute to effective compression.

Similarly, numeric dictionary segments are selected based on the percentage of numeric data in the interrogation string as compared with the total data in the interrogation string. The percentage of the most frequent digit relative to all the digits in the interrogation string is compared with a threshold value to determine if a numeric dictionary segment corresponding to the digit should be used. The selection strategy is similar to that of the run suppressor strategy described above. The alphabetical dictionary segments are selected based on a discriminate function that determines the deviation of the interrogation string from a possible language, which in the preferred embodiment is the English language. Users will select different languages based on the input data being compressed. For both upper and lower case letters, it must be determined if the interrogation data corresponds to the proposed language (English) and if the use of that language is sufficiently extensive to warrant selection of the corresponding dictionary segment.

The discriminate function used in the preferred embodiment comprises the so-called cross-entropy function, also called the Kullback-Liebner diversion. Thus, the cross-entropy function is one of the preferred interrogation statistics computed by the compression management processor. The function measures the deviation of the interrogation string from the zero-order character statistics. In particular, the cross-entropy function K is defined by $$K(p,q) = \Sigma p_i(-\log q_i + \log p_i)$$

where the function is evaluated over a set of characters having size N, the summation index extends from i=1 to N, $p_i$ is the probability of the ith character computed from the data and $q_i$ is the generic probability of the ith character expected for a class of data. For example, the set $q_i$ might be the well-known set of expected probabilities for alphabet letters in general English language text. The $q_i$ probabilities are typically derived from very large samples of the class of data under consideration. Other sets of expected probabilities for letters are easily obtained, for example, corresponding to French, German, Italian, and Spanish text. Yet other sets of probabilities can be determined for particular data sets.

The control dictionary segments are selected based on finding the percentage of most frequent control characters relative to all control characters in the interrogation string. If the percentage exceeds a control character threshold, then a corresponding control dictionary segment is automatically selected. Another control character selection criteria is if the NULL character is the most frequent control character. If it is, then a threshold value is used to decide if any dictionary segment corresponding to all the pairs of a non-NULL low-control character and the NULL character should be excluded. Finally, if the NULL and EBCDIC X'0C' are sufficiently popular, then a dictionary segment corresponding to the alternate occurrence of NULL and EBCDIC X'0C' is selected. The threshold values described above will vary according to the data that particular processing systems are expected to encounter and typically are already known or can be obtained easily by those skilled in the art.

In accordance with the present invention, during the dictionary selection step indicated in the flow diagram box numbered 102, certain dictionary segments that have a high correlation between the characters they are suited to compress and the character frequency of the interrogation string are selected as "must have" segments for the system-built dictionary to be constructed. In the next step indicated in the flow diagram box numbered 104, other dictionary segments that are not as strongly correlated with the interrogation string characters are designated as sampling candidates to be included or not included in the system-built dictionary as a result of a sampling process, to be described in greater detail below. Thus, for each of the dictionary segment selection criteria described above, there can be two sets of threshold criteria. A first threshold determines whether a dictionary segment is automatically selected to be part of the system-built dictionary, while another threshold determines whether the same or similar dictionary segment is designated a system-built candidate for sampling.

After the set of "must have" dictionary segments is automatically selected and the candidate segments are identified, the next step illustrated in FIG. 5 by the box numbered 106 is to sort the selected dictionary segments by character frequency. That is, the dictionary segments are sorted in the order of decreasing number of character matches for the particular segment. The next step at the decision box 108 is to determine if sampling candidate segments were identified. If no sampling candidate dictionary segments were identified, then a sampling needed flag is set at box 109 and then the interrogation process ends at box 98. If sampling candidate dictionary segments were identified, then the next step at box 110 is to proceed with sampling.

The processing of the interrogation module illustrated in FIG. 5 will be better understood with reference to the following pseudocode of the IN module:

```
PROCESS IN.
Input:
    input character string;
    interrogation statistics buffer
Output:
    updated interrogation statistics buffer;
    list of selected dictionary segments;
    list of sampling candidate dictionary segments;
    interrogation complete flag;
    sampling needed flag;
Variables:
    BYTE_COUNT           byte count of characters
                         for input string pointer
                         (initialized to 0);
    BYTE_COUNT_CHKPT     pointer to end of input string
                         (initialized to 4096);
    FREQ_COUNT           frequency count value for
                         each input string character
                         (initialized to 0);
Function:
    INTERROGATION STABILIZED
    Determines if scanned character string
    record is stabilized; set to TRUE
    (stabilized) or FALSE.
MAIN LOGIC.
If (BYTE_COUNT + input string length) <
BYTE_COUNT_CHKPT then:
    1. For every character in the input
       string, increment corresponding
       character FREQ_COUNT.
    2. Increment BYTE_COUNT by
       input string length.
    3. Return.
Else
    For the beginning substring of
    length (BYTE_COUNT_CHKPT −
    BYTE_COUNT), do:
        1. For every character in the substring,
           increment corresponding character
           FREQ_COUNT.
        2. Increment BYTE_COUNT by substring
           length.
        3. Case BYTE_COUNT=BYTE_COUNT_CHKPT:
           At first checkpoint
           (BYTE_COUNT_CHKPT=4096):
               Calculate interrogation statistics from
               FREQ_COUNT and save it in buffer.
               Double BYTE_COUNT_CHKPT value.
           At maximum interrogation size
           (BYTE_COUNT_CHKPT=65536):
               Calculate new interrogation statistics
               from FREQ_COUNT and save it in
               buffer.
               Call END_INTERROGATION.
           Between first checkpoint and max
           interrogation size:
               Calculate new interrogation statistics
               from FREQ_COUNT.
               Compare new statistics with statistics
               in buffer.
               If INTERROGATION_STABILIZED=
               TRUE, then
                   Save new interrogation statistics
                   in buffer.
                   Call END_INTERROGATION.
               Else
                   Save new interrogation statistics
                   in buffer.
                   Double BYTE_COUNT_CHKPT.
        4. Loop back to (1.) to process the remaining
           substring.
```

In the pseudocode above, the module input is listed as an input character string and an interrogation statistics block, which is maintained in the memory buffer 29 illustrated in FIG. 3. The output is listed as the updated interrogation statistics, a list of the dictionary segments (listed as "DBB" for dictionary building block) selected for the system-built dictionary, a list of the candidate dictionary segments selected for the sampling phase, an interrogation complete flag (INTERROG_COMPLT) and a sampling needed flag. Variables used by the IN module include a BYTE_COUNT that keeps track of the number of character bytes already interrogated, BYTE_COUNT_CHKPT designating predetermined blocks of the input string that can be set equal to the fixed interrogation sizes, and a FREQ_COUNT variable for each character, in which the corresponding character count is stored. The interrogation complete, byte count, and frequency count variables are initialized to zero. The BYTE_COUNT_CHKPT is initialized to a value of 4K, or 4096 bytes.

In the first part of the pseudocode, the interrogation module checks to ensure that only the predetermined portion of the input string is interrogated, or scanned. The module does this by determining if the sum of the current value of the BYTE_COUNT pointer (which indicates the portion of the input string being scanned) plus the input string length is less than the BYTE_COUNT_CHKPT value. If the sum is less, then for every character in the module input string, the corresponding frequency count for the character is incremented, the BYTE_COUNT pointer value is incremented by the input string length, and processing continues. If the sum is not less than the value, meaning that the BYTE_COUNT_CHKPT has been reached, then for the current substring beginning at the input string location equal to BYTE_COUNT_CHKPT minus the BYTE_COUNT value, the following steps 1, 2, 3, and 4 are carried out.

Step 1 comprises incrementing the character occurrence count value FREQ_COUNT for each character in the substring. Step 2 comprises incrementing the BYTE_COUNT value by the substring length. This moves the substring pointer along in the record block. Step 3 comprises checking for whether the pointer is at the initial interrogation checkpoint, a maximum interrogation size checkpoint, or an intermediate checkpoint. At the initial checkpoint, reached after the first 4K bytes have been interrogated, the interrogation statistics are calculated from the FREQ_COUNT values and are saved in the interrogation statistics in the data buffer. The interrogation statistics include, for example, the relative frequency of the characters being counted by FREQ_COUNT. The BYTE_COUNT_CHKPT value is then doubled in preparation for the next comparison. Processing then returns to step 1 for processing the next substring. If the maximum interrogation size has been reached, which occurs when BYTE_COUNT is equal to 64K, then the new interrogation statistics are calculated and saved in the data buffer. The interrogation process then ends with a call to the END_INTERROGATE process. If one of the intermediate checkpoints has been reached, then the new interrogation statistics are calculated, the new statistics are compared with the prior statistics stored in the buffer, and if stabilization criteria (meaning that the function INTERROGATION_STABILIZED is set to TRUE) are met, then the new statistics are saved in the buffer and the END_INTERROGATE process is called. The record block that will be used for dictionary segment selection is therefore equal to the block extending from the start of the data set to the current value of BYTE_COUNT_CHKPT. If the stabilization criteria are not met, then the new interrogation statistics are saved in the buffer, the value of BYTE_COUNT_CHKPT is doubled, and processing returns to step 1.

The next portion of pseudocode relates to the Interrogation_Stabilized processing:

```
INTERROGATION STABILIZED.
If new ENTROPY > .75 then
Return FALSE.
Elseif (GROUP_FREQ_COUNT, new
    GROUP_FREQ_COUNT) deviation <
    threshold and (TOP_CHAR_FREQ_COUNT,
    new TOP_CHAR_FREQ_COUNT) deviation
    < threshold, then
    Return TRUE
Else
    Return FALSE.
```

In the pseudocode above, if the input string entropy value E from the interrogation statistics (defined above) for the new input string block is greater than an entropy threshold value, then the INTERROGATION_STABILIZED flag is set to FALSE to indicate that the data is not yet indicated as being suitable for compression. The entropy threshold value is set equal to 0.75 in the preferred embodiment, but as known to those skilled in the art, other values may be set as desired. If the entropy value from the statistics is less than or equal to the entropy threshold value, then group frequency counts from the interrogation statistics described above are compared with the new group frequency counts to determine if the deviation between the two is below a variance threshold. The deviation can comprise, for example, the cross entropy function described above for the various character groups over the respective group distributions. The deviation between the greatest character frequency count from the prior set of interrogation statistics and the greatest character frequency count from the new statistics also are compared with a variance deviation threshold. The greatest character frequency count can correspond, for example, to the frequency counts of the eight greatest frequency characters. The deviation can comprise, for example, the cross entropy function described above, taken over the eight greatest frequency characters. If both character deviation statistics are below their respective thresholds, then the interrogation flag INTERROGATION_STABILIZED is set equal to TRUE. The flag otherwise is set equal to FALSE.

The next portion of pseudocode is for the End_Interrogation phase processing that actually carries out the dictionary segment selection (a dictionary segment is indicated as a DBB, or dictionary building block):

```
END_INTERROGATION.
If ENTROPY > .75 (or entropy_threshold) then
    Set INTERROG_COMPLT flag on.
    Return without any DBBs (i.e., rejected for
    compression.)
(In the following, probability P =
FREQ_COUNT / BYTE_COUNT)
For each of X'00 & '',
    If P >= run_20_threshold, then
        select length-20 run DBB for dictionary.
    If P >= run_200_threshold_2, then
        select length-200 run DBB for dictionary
    elseif P >= run_200_threshold, then
        select length-200 run DBB for sampling
    elseif P >= run_40_threshold, then
        select length-40 run DBB for sampling.
For each of "*", "-", "."
    If P >= run_20_threshold, then
        select length-20 run DBB for dictionary.
    If P >=run_40_threshold, then
        select length-40 run DBB for sampling.
For any character (except X'00', X'40', "*", "-", "."),
    if P >= run_20_threshold, then
        select length-20 run DBB for dictionary.
For each character not selected above,
    if probability_within_group >=
    run_20_threshold_2, then
        select length-20 run DBB for sampling.
If numeric_group_probability >= 2_digit_threshold, then
    select 2-digit numeric DBB for dictionary.
If numeric_group_probability >= 3_digit_threshold, then
    select 3-digit numeric DBB for sampling.
If (combined probability of 2 most frequent digits) >=
6-digit_threshold_1, then
    select 6-char-long-2-digit-permutation DBB
    for dictionary
elseif 6-digit_threshold_1 > (combined probability of
two most frequent digits) >= 6-digit_threshold_2, then
    select 6-char-long-2-digit-permutation DBB
    for sampling.
If combined probability of X'00 and X'0C >=
    000C_threshold and probability of X'00
    >= 000C_00_threshold and probability of
    X'0C >= 000C_0C_threshold, then
    select 24-char "000C" DBB for dictionary.
If X'00 probability_within_group is highest and
    any of X'01 - X'3F probability_within_group
    >= low_control_threshold, then
    select 6-character null-low-control-permutation
    DBB for dictionary.
If (Alpha_probability >= text_threshold_2) and
    (English_entropy <= English_threshold), then
    Select English base DBB (i.e., combination of
    prefix_2_gram, suffix_2_gram, 3-gram I)
    and English Option-1, 2, 3, DBBs for sampling
else
    If (Alpha_probability >= text_threshold_1) then
        Select English base DBB (i.e.,
        combination of prefix_2_gram,
        suffix_2_gram, 3-gram I) for dictionary.
```

The pseudocode above shows that, if the entropy value from the interrogation statistics is greater than 0.75 or some other entropy threshold value, then the INTERROG_COMPLT flag is set to ON. Such a relatively high entropy value indicates that the input string is not suitable for compression. The INTERROGATION_STABILIZED flag will be returned with its value set to FALSE. The remaining portion of the pseudocode relates to the automatic selection of dictionary segments and the designation of candidate segments for sampling. In the pseudocode, the phrase "probability" refers to a FREQ_COUNT character frequency count value divided by the BYTE_COUNT value.

The first section of the dictionary selection portion of the END_INTERROGATION pseudocode relates to the NULL characters. It is readily apparent from the pseudocode that three dictionary segments specially suited to compressing the null character can potentially be selected. Dictionary segments are selected by having an identifier representing the segment added to a running list of identifiers, repressing selected segments, temporarily stored in the data buffer. A sampling list also is maintained. The probability of a null character occurrence in the input string is tested against a run_20_threshold value. If the occurrence probability is greater than the threshold value, then a corresponding "length-20" dictionary segment is automatically selected for the system-built dictionary. The next portion of pseudocode shows that if the null character probability of occurrence is greater than or equal to a run_200_threshold value, then a corresponding "length-200" dictionary segment is automatically selected. If the run_200_threshold value is not met, then if the probability of a null character occurrence is less than a second run_200_threshold, then the length-200 dictionary segment is designated for sampling. If this conditional is not met, then the null occurrence probability is checked to determine if it is greater than or equal to a run_40_threshold value. If it is, then a corresponding "length-40" dictionary segment also is designated for sampling.

The next section of pseudocode relates to characters comprising the asterisk, hyphen, and period (*, -, and ., respectively). If the occurrence of any of these characters is greater than or equal to a run_20_threshold value, then a corresponding "length-20" dictionary segment is automatically selected for the system-built dictionary. If the probability of occurrence of any of these characters is greater than or equal to a run_40_threshold value, then a corresponding "length-40" dictionary segment is designated for sampling. The remaining characters are checked against the run_20_threshold value in the next portion of pseudocode.

In the next section of interrogation pseudocode, the probability of a character occurring within one of the code groups described above is checked. That is, in the preferred embodiment, these groups are defined to include uppercase alphabetic characters, lowercase alphabetic characters, numeric characters, special print characters, low control characters, and other control characters. The pseudocode shows that combined probabilities for different characters also are analyzed against various threshold values. The nature of the dictionary segments being selected and designated for sampling should be apparent to those skilled in the art in view of the dictionary titles listed in the pseudocode. Those skilled in the art will further appreciate that the pseudocode indicates that interrogation statistics are computed according to each one of the character groups as well as for the individual characters. Thus, the probability of an alphabetic character occurring is computed for comparison, as is the entropy value for English phrases for selection of English language dictionary segments.

After dictionary segments have been automatically selected or designated for sampling, the further END_INTERROGATION pseudocode below shows that the list of dictionary segments is sorted in order of decreasing frequency count, where the frequency count of a dictionary segment is equal to the number of occurrences of characters in the input string matching to that dictionary segment:

```
END_INTERROGATION (continued).
Sort DBB list in decreasing frequency.
If DBB list has more than 16 DBBs then
    discard the lowest frequency DBBs
    and keep only 16;
    discard all DBBs on sampling list.
If total size of DBBs in the list is greater
than 8K entries, then
    discard lowest frequency DBBs
    until total size is less than or equal
    to 8K entries;
    discard all DBBs on sampling list.
If no DBBs identified for sampling, then
    add up the sizes of DBBs selected
    for dictionary;
    rank the selected DBBs by group
    probability,
    If total DBB size is less than 512
    entries, then
    do nothing to DBB list
    else
    If total DBB size is smaller than ¾
    of dictionary size, and removing the
    lowest ranked DBB will result in the
    next smaller dictionary size, then
        remove the lowest ranked
        DBB from the list;
        else
        do nothing to DBB list.
```

```
If any DBBs identified for sampling, then
    if final dictionary size of (DBBs for
    dictionary + DBBs selected for
    sampling) = final dictionary size of
    only DBBs selected for dictionary
    and total number of DBBs selected
    for dictionary and identified for
    sampling is less than or equal to 16, then
        move DBBs from sampling list
        to the DBBs for dictionary list;
    else
        set SAMPLING_NEEDED flag on.
Set INTERROG_COMPLT flag on.
Return.
```

The pseudocode listed above for the END_INTERROGATION(continued) processing after sorting shows that a maximum number of sixteen dictionary segments can result from the automatic selection process. That is, no system-built compression dictionary can have more than sixteen dictionary segments. Therefore, if the list of automatically selected dictionary segments is greater than sixteen, then the sixteen highest frequency dictionary segments are kept and the remaining segments are deleted from the list.

The pseudocode above also indicates that there is a maximum total size limit on the system-built dictionary segments. In particular, if the automatically selected dictionary segments have a total size that is greater than 8K entries, then the lowest frequency dictionary segments are discarded one by one until the total number of entries of the automatically selected dictionary segments is less than or equal to 8K. If any automatically selected dictionary segments must be deleted, then all of the candidate dictionary segments identified for sampling also are deleted.

In the next pseudocode step, if no candidate dictionary segments (DBBs) were identified for sampling, then all of the automatically selected dictionary segments are ranked by character group probability. The number of automatically selected dictionary segments is next pruned according to predetermined system-built fixed dictionary sizes. In particular, system-built dictionaries are permitted to have 512 entries, 1K entries, 2K entries, 4K entries, or a maximum of 8K entries. These size limits are established to control dictionary growth and to make manipulation of the dictionaries easier. It should be understood that each dictionary segment may contain almost any number of dictionary entries. Some dictionary segments, for example, may contain as few as twenty entries and others may contain more than one thousand.

If the total size of the automatically selected dictionary segments is less than 512 entries, then no change is made to the list of dictionary segments. If, however, the total size of the selected dictionary segments is less than three-fourths of the smallest fixed dictionary size in which it can be contained, and if removing the lowest ranked dictionary segment will result in the next smaller fixed dictionary size, then the lowest ranked dictionary segment is removed from the list. The list otherwise is not changed. The automatically selected dictionary segments having been ordered according to character frequency and pruned, the sampling phase can begin.

In the next section of pseudocode, if any candidate dictionary segments (DBBs) were identified for sampling, then a check is made to determine if all of the candidate dictionary segments can be added without size penalty by checking the final dictionary size. That is, if the fixed dictionary size (512, 1K, 2K, 4K, or 8K entries) resulting from combining the automatically selected dictionary segments and all of the candidate dictionary segments is equal to the dictionary size of the automatically selected dictionary segments alone, and if the total number of dictionary segments both automatically selected and identified for sampling is less than or equal to sixteen, then all of the candidate dictionary segments identified for sampling are added to the list of selected dictionary segments. The SAMPLING_NEEDED flag otherwise is set to ON. The INTERROG_COMPLT interrogation complete flag is then set to ON and the process returns.

Figure 6:
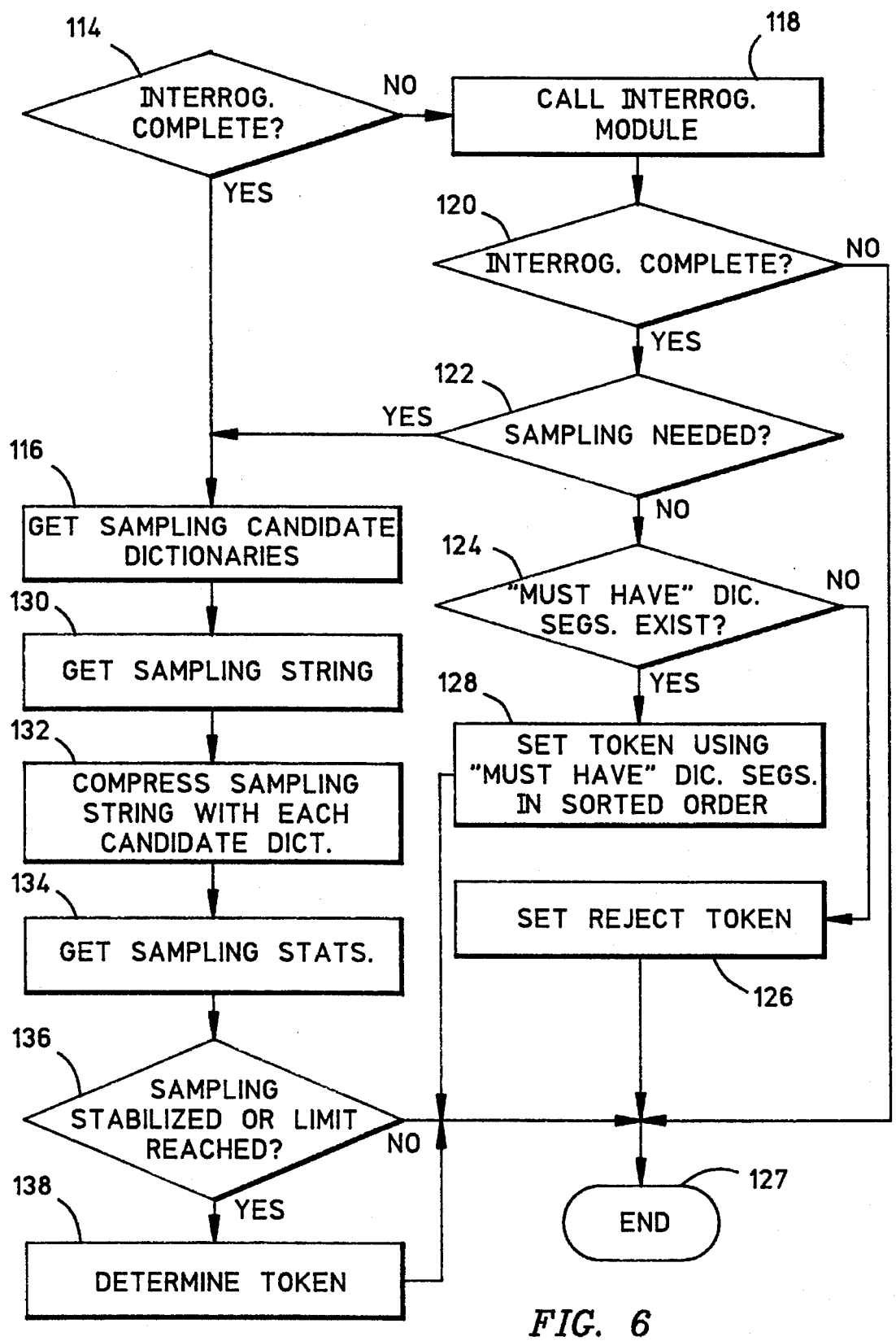
FIG. 6 is a flow diagram representing the processing steps performed by the SA module illustrated in FIG. 3.

After the interrogation process ends, if any candidate dictionary segments for sampling were identified, the system carries out the sampling phase. A flow diagram of the steps followed in the sampling phase, representing the operation of the SA module, is illustrated in FIG. 6. The first step performed by the SA module, indicated by the flow diagram box numbered 114, is to determine if the SA module was called after the interrogation process has completed by checking the INTERROG_COMPLT flag. If the flag indicates interrogation has been completed, then processing will proceed directly with the sampling phase at the flow diagram box numbered 116. The sampling phase will occur only when interrogation ends and sampling is needed. If interrogation has not been completed, then the SA module will call the interrogation module at box 118 and upon return will perform post interrogation processing by calling a routine called POST_IN.

During the post interrogation processing, if interrogation has been completed (the check performed at box 120) and if there were no identified sampling DBBs (indicating at box 122 that sampling is not needed) and there were no selected "must have", mandatory DBBs at box 124, then a reject token is set at the box numbered 126. Processing for this module then ends at box 127. Back at box 124, if there were "must have" selected dictionary segments, then at box 128 the dictionary identifiers are set using the "must have" selected dictionary segments (DBBs). In particular, the dictionary segments will be sorted by their identifiers and a system-built dictionary token will be created by concatenating the identifiers together. If the post interrogation processing check at box 120 found that interrogation still had not been completed, then processing for this module is ended at box 127.

If sampling is to take place, the first step is for the candidate dictionary segments to be obtained at the box numbered 116. The dictionary segments initially will be arranged in the order in which they were identified during the interrogation process. The next step is to place the sampling input string portion, typically the interrogation string, in the data buffer for compression, as indicated at the flow diagram box numbered 130.

The next step, at box 132, is to compress the sampling input string using each of the candidate dictionary segments. At the box numbered 134, sampling statistics are computed for the result of compressing the sampling string with each candidate dictionary segment. At the flow diagram box numbered 136, the sampling statistics are analyzed to determine if a stable set of candidate dictionary segments has been identified or if the maximum mount of data has been sampled. Either one of these two conditions will terminate the sampling process and permit the dictionary token determination process to proceed at box 138.

Figure 7:
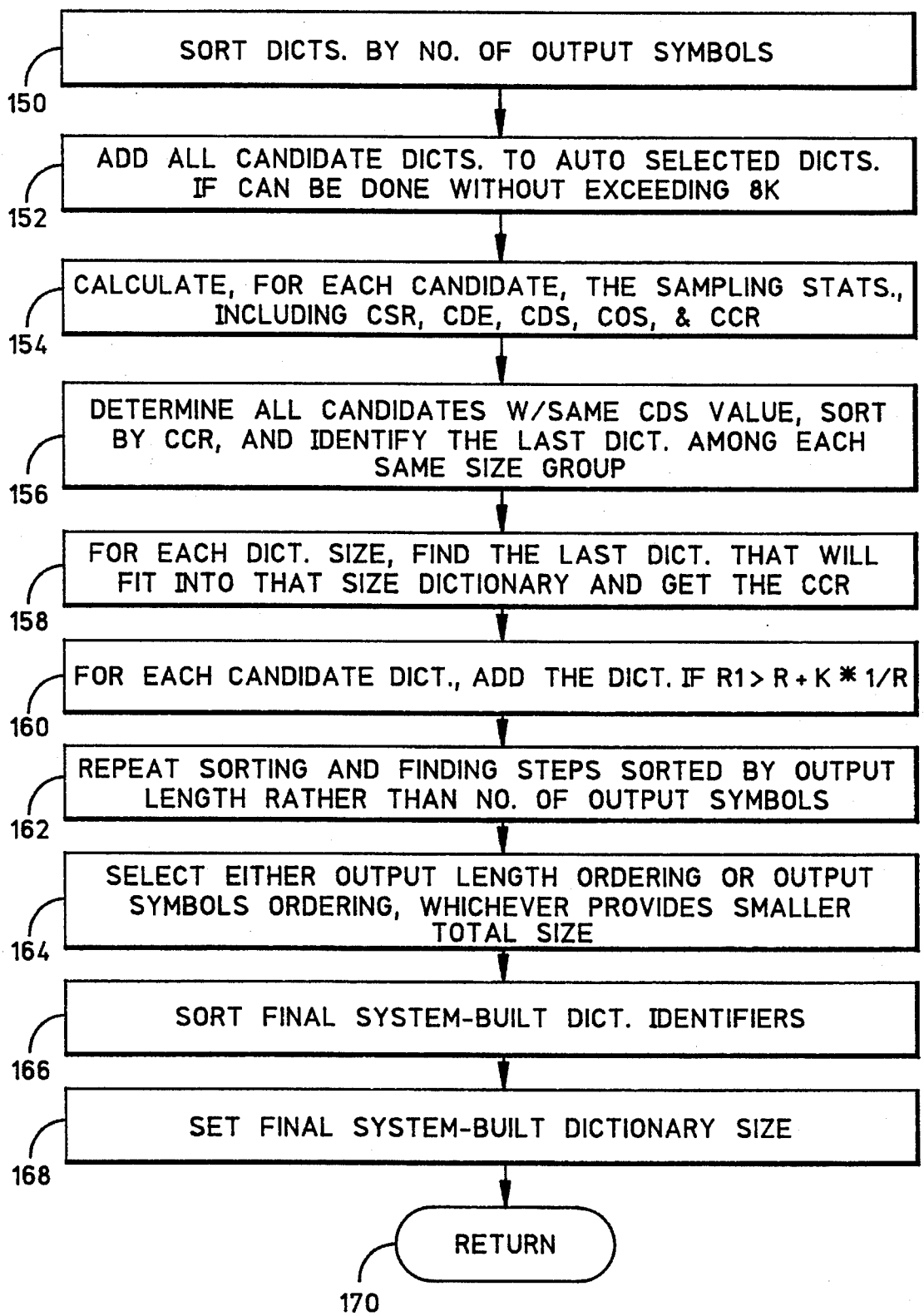
FIG. 7 is a flow diagram representing the processing steps performed by the SA module in determining a dictionary token.

The flow diagram of FIG. 7 illustrates the process of determining the system-built dictionary token. As indicated at the first flow diagram box 150 of FIG. 7, to determine the token the SA module process first sorts the automatically selected and identified candidate dictionary segments in order of increasing number of compression output symbols. At box 152, the process then adds all of the candidate dictionary segments to the list of automatically selected dictionary segments if the dictionary size of the selected dictionary segments is greater than 4K bytes. This is because the smallest (and final) dictionary size in such a case will have to be 8K and thus no dictionary size determination is needed. Next, at the box numbered 154, the process calculates the compression statistics including combined symbol reductions (CSR), number of combined dictionary entries (CDE), combined dictionary size (CDS), combined number of output symbols (COS), and combined compression ratio (CCR). In each case, the indication of a combined statistic indicates a cumulative calculation that assumes all preceding candidate dictionary segments were included in the compression dictionary to generate the statistics.

Next, at box 156, the SA module determines all dictionary segments having the same CDS value and identifies the last segment in each equal-sized CDS group. At box 158, the process finds the last dictionary segment (including the preceding dictionary segments in the sorted list) that will fit into each different dictionary size (512, 1K, 2K, 4K, or 8K) and determines the cumulative compression ratio (CCR) for that dictionary. To determine the candidate dictionaries to be added to the system-built dictionary, the process determines which size dictionary should be used. To make this determination, at box 160 the process tests the inequality $$R1 > R + K*1/R$$

where R1 is the compression ratio of the next smaller dictionary size compared with the larger dictionary, which provides a compression ratio of R, and K is a scaling constant. The initial R value is set to the lowest compression ratio (which may or may not be associated with the largest size dictionary in the sorted list). If the inequality is true, then it indicates that the compression ratio is increased sufficiently by the additional dictionary segments to warrant a larger size. Therefore, the larger dictionary size is selected. The initial R1 value is set to the compression ratio of the second lowest compression ratio in the sorted list. The inequality takes into account that under certain circumstances some compression performance can be sacrificed to save dictionary space. The constant K is a judgment by the system designer of the degree to which compression must be improved before a larger dictionary size will be accommodated. In the preferred embodiment, K is set equal to one hundred. Using this formula, the "most-fit" dictionary size is determined. If this inequality between two valid adjacent dictionary sizes is not satisfied, the R becomes R1 and R1 will be set to the CCR of the next valid smaller dictionary size. The process will continue until the inequality is true or the CCR of the smallest valid dictionary size has been tested.

It should be noted that the system considers both the number of output compression symbols and the output compression size, or length, in determining the final system-built dictionary size. The number of output symbols refers to the number of compression symbols that represent the original data set after the compression process is concluded. The output length refers to the number of bytes comprising the output compression symbols. The correlation between the two is that the number of output symbols can be determined from the output compression length and the size of the dictionary used to perform the compression. In particular, the system permits system-built dictionaries of 512, 1K, 2K, 4K, and 8K bytes, which correspond to the integer two raised to n, where n=9, 10, 11, 12, and 13, respectively. Thus, the number of output symbols is equal to the output length, multiplied by eight bits, divided by n, where n is equal to the exponent of the dictionary size. A particular example illustrates the motivation for considering both the number and length of output compression.

Suppose an input string comprises 100 bytes of characters and the compression output has a length of 108 bytes using a system-built dictionary having 512 compression symbols. Considering output length alone might indicate that a larger size dictionary is needed. The number of output symbols, however, is equal to 108*8/9=96. Thus, the input string has been compressed from 100 symbols (characters) to 96 symbols. Suppose further that there are five such dictionary segments, each of which provides a symbol reduction of four (from 100 symbols to 96 symbols). If a system-built dictionary is constructed from each of them, each dictionary will be a 512-entry dictionary. Suppose, however, that each of the five dictionary segments by itself has less than forty entries (which is highly probable) and that, when all five are added together, can form a 512-entry dictionary. Thus, the combined total number of symbol reductions is twenty (5*4).

It should be apparent that considering output length alone can be misleading and that benefits can be obtained by considering both parameters. That is, the next larger size dictionary will not necessarily provide greater compression performance in terms of numbers of output symbols sufficient to warrant its larger size. Therefore, the comparison between the number of output symbols and output length is done in recognition of the fact that the largest dictionary size might not produce the lowest compression ratio.

In accordance with the discussion above, at the flow diagram box numbered 162, the process repeats the box 160 processing and the inequality determination based on the compressed output length rather than a number of compressed symbols. At box 164, the two resulting sets of statistics are compared and the one having the lower combined dictionary size is selected as the final size. Next, at the box numbered 166, segment identifiers (referred to as DBB in the pseudocode) corresponding to each one of the automatically selected and sampling selected dictionary segments finally decided upon are sorted according to their identifier code. For example, if all dictionary segments in the library are identified with a two-letter alphanumeric code, then at box 166 they are sorted into alphabetic-numeric order. One or more padding dictionary segments are added, if necessary, to fill the dictionary to the selected dictionary fixed size. The concatenated identifiers, including those for the padding dictionary segments, then can be used as a dictionary token to help in the storage, retrieval, and identification of system-built dictionaries. For example, the token permits the system to identify two system-built dictionaries as being identical simply by comparing their tokens or concatenated identifiers. Finally, at box 168, the final system-built dictionary size is set according to the final dictionary segments and the process returns at box 170.

As noted above, the sampling process is initiated when the SA module is called by the CM module via the PC module. The following pseudocode represents the steps followed by the SA module in implementing the flow diagram of FIGS. 6 and 7:

```
SA MAIN MODULE.
    If INTERROG_COMPLT then
        call SAMPLING_PROCESS;
    Else
        call IN (INTERROGATION);
        call POST_IN;
    Exit.
```

In the pseudocode above for the sampling module, the MAIN MODULE comprises a test for the completion of interrogation and, if there is completion, a call to the SAMPLING_PROCESS module. That is, if the interrogation complete flag is set to ON, then processing transfers to the section for sampling. Otherwise, control is transferred to the interrogation module IN and then to a post-interrogation module POST_IN. The interrogation module processing has been described above. The post-interrogation module processing is described below.

```
POST_IN.
    If CMDS_INTERROG_COMPLT then
        If no mandatory and sampling DBBs
        are selected then
            set rejection token
        If CMSDS_SAMPLING_NEEDED=OFF then
            set the dictionary token using the
            mandatory DBBs
        Else
            call SAMPLING_PROCESS.
SAMPLING_PROCESS.
    If the sampling dictionaries are not loaded, then
        Turn on LOAD_SAMPDICT.
        Loop until no more sampling DBBs to load.
            Call BD to build the sampling
            dictionary in storage and pass in
            the pointer to the DICT_ADDR.
    If the data in the INTERROGATION buffer has
        not been sampled, start with it.
        Else, start with the buffer from the caller.
    Get sampling buffer.
    For each sampling dictionary,
        Compress the data buffer.
        Add the number of output symbols
        and the output length information into
        corresponding counter of the control
        block. Increment SAMPLE_TOTAL
        by the data buffer length.
        Call ANALYZE_SAMPLE to analyze
        the sampling statistics and come up
        with a new SAMPLE_TOP_HALF
        value (L_TOP_HALF).
        If ((L_TOP_HALF is the same as
        SAMPLE_TOP_HALF) | (SAMPLE_TOTAL
        >= GLBL_MAX_SAMPLING)) then
            Set SAMPLING_COMPLT on.
        Else
        Replace the SAMPLE_TOP_HALF
        value with the new L_TOP_HALF.
        If SAMPLING_COMPLT = ON then
        call DETERMINE_TOKEN.
        Set return code accordingly.
```

In the SAMPLING_PROCESS pseudocode, the candidate dictionaries identified for sampling are first loaded into the memory. Next, a sampling input string to be compressed is obtained. Typically, the data to be compressed for the sampling process is the same data used for the interrogation string and is placed in a sampling buffer of the data buffer. Alternatively, as described below, subsequent processing can test selected blocks of the input string to determine if sufficient changes have occurred to warrant a new dictionary segment selection process. After the sampling input string is obtained, for each candidate dictionary segment, the contents of the interrogation buffer are compressed and placed in the sampling buffer. Statistics on the output stored in the sampling buffer are then collected, including the number of output symbols and the output length. Next, the sample total variable is incremented by the length of the data in the interrogation buffer. The next portion of the pseudocode indicates that a call is made to the ANALYZE_SAMPLE process to analyze the sampling statistics and identify the subset of the candidate dictionary segments having the greatest compression ratios, as described further below. Next, the new subset of best dictionary segments is compared with the previous subset of the best dictionary segments. If the new best subset of dictionary segments are the same as the previous top half segments, or if the sample total variable is greater than a global maximum sampling value, then the sampling complete flag is set to ON. When the sampling complete flag is set to ON, it indicates that no more data will be compressed (sampled) using the sampling dictionary segments. Otherwise, the previous top half segments are replaced with the newly identified best segments ranked in the sampling buffer. The SAMPLING_PROCESS then returns.

The next portion of the pseudocode relates to the DETERMINE_TOKEN processing ("DBB" refers to one of the dictionary segments, also called dictionary building blocks):

```
DETERMINE_TOKEN.
A.    Sort the DBBs by the number of output
      symbols.
A1.   If the combined number of dictionary entries
      for all the DBBs returned in DBB_POINTER >
      4096, then
          Loop through the sorted DBBs until
          done;
          If the number of dictionary entries is
          < 8K – running number of dictionary
          entry, then
          Add the dictionary entries to
          the running number of dictionary entry
          Else
              done = ON.
              Exit.
B.    Calculate the following fields for each DBB
      in the sorted order:
      a) The combined number of symbol
         reductions (CSR) = summation of
         the symbol reductions from the first
         DBB's value to the current
         DBB's value;
      b) The combined number of dictionary
         entries (CDE) = summation of the
         number of dictionary entries from
         the first DBB's value to the current
         DBB's value. The CDE for the first
         DBB in the sorted table should add
         256 + the total number of dictionary
         entries of the DBBs pointed to by
         the DBB_POINTER.
      c) The combined dictionary size (CDS):
         when CDE <= 512, this value is 512
         when 512 < CDE <= 1024, value is 1024
         when 1024 < CDE <= 2048, value is 2048
         when 2048 < CDE <= 4096, value is 4096
         when 4096 < CDE <= 8192, value is 8192
         when 8192 < CDE, this DBB and all the
         subsequent DBBs will not be considered as
         candidate DBBs and will have a null value.
      d) The combined number of output
         symbols (COS) = input length – CSR.
      e) The combined compression ratio (CCR) =
         (COS * x / 8) / input length, x = number
         of bits in symbol,
         where   x = 9 when CDS = 512
                 x = 10 when CDS = 1024
                 x = 11 when CDS = 2048
                 x = 12 when CDS = 4096
                 x = 13 when CDS = 8192.
C.    0.  Start from the top of the sorted table.
      1.  For all the DBBs which have the
          same CDS value, use the information
          associated with the last DBB entry
          (DBB_L) in this group to perform
          the next step. Specifically, look at
          the CCR value of DBB_L (CCR_L).
          These values are stored in the
          L_CCR_TBL structure.
D.    Comparison:
      1.  Find the DBB_L that has the lowest
          CCR value.
      2.  Set the CURRENT_CDS to the CDS
          whose CCR_L has the lowest CCR
          value among all CCR_L values. The
          PREV_CDS will be the next lower
          dictionary size.
      3.  Set the LOWEST_CDS to the CDS
          of the DBBs selected by interrogation
          (pointed to by DBB_POINTER).
      4.  Start with the DBB_L of the
          CURRENT_CDS.
      5.  If CCR_L(PREV_CDS) >
          CCR_L(CURRENT_CDS) + K *
          CCR_L(CURRENT_CDS) then
              stop, set FINAL_CDS = CURRENT_CDS,
          Else
              If PREV_CDS = LOWEST_CDS then
                  CURRENT_CDS = NEXT_CDS
                  PREV_CDS = the next lower CDS;
                  goto D.4
              Else
                  FINAL_CDS = PREV_CDS.
E.    Repeat A–D, but sort by compressed output length.
F.    Compare the result of D and E, select the better
      one by using D.3 criteria (FINAL_CDS).
G.    Sort the DBB identifiers in the selected
      set (i.e., from the first DBB to the
      DBB_L(FINAL_CDS)) and add pad fill
      if necessary.
H.    Set DICT_SIZE to FINAL_CDS.
```

The pseudocode indicates that the dictionary segments are first sorted according to the number of output symbols they include. Next, if the combined number of dictionary entries for all dictionary segments is greater than 4K, then the sorted dictionary segments are scanned such that dictionary entries are added to a running dictionary entry total up to a maximum total value of 8K bytes. Thus, the process adds candidate dictionaries until the maximum total size of 8K is reached. The next section of pseudocode labeled "B" calculates the various sampling statistics. Those skilled in the art will readily understand the processing specified by the pseudocode and no further explanation is required.

The next block of pseudocode under paragraph "C" and paragraph "D" relates to trading off the size of a candidate dictionary segment for the improvement in compression ratio obtained by adding the candidate dictionary segment. First, the last candidate dictionary segment (designated DBB_L) is identified, and its corresponding combined compression ratio (designated CCR_L) is stored in the sampling buffer statistics. A comparison is then carried out in which the DBB_L having the lowest combined compression ratio value is identified and the current combined dictionary size is set to the combined dictionary whose CCR_L value has the lowest compression ratio among all of the CCR_L values. Thus, a previous size variable called PREV_CDS is the next lower dictionary size.

Next, the lowest combined dictionary size is set to the size of the dictionary segments selected by interrogation alone, called LOWEST_CDS. In a comparison step, if the CCR_L value of PREV_CDS, the previous combined dictionary size, is greater than the CCR_L value of the current dictionary size plus the result of dividing a scaling factor by the CCR_L value of the current combined dictionary, then sampling is halted and the final combined dictionary size is set equal to the current dictionary size. Otherwise, if the previous dictionary size was not equal to the lowest combined dictionary size, then the current dictionary size is set equal to the previous dictionary size PREV_CDS and the PREV_CDS value is set equal to the next lower dictionary size. Processing then returns with step 4. Otherwise, the final dictionary size is set equal to the previous dictionary size.

Next, the prior token determining steps are repeated for the dictionary segments being sorted by the combined compressed output length rather than the number of compressed symbols. The comparison of the selection process from sorting by the number of compressed symbols and sorting by the compressed output length is compared and the better arrangement is selected according to predetermined selection criteria. Next, in the step labelled "G", the dictionary segment identifiers are sorted. For example, the identifiers can be placed in alphabetical order or in order of display code representation. Padding dictionary segments can be added if necessary to fill the system-built dictionary out from the end of the last dictionary segment to the selected dictionary fixed size. The identifiers for the added padding dictionary segments will be added to the final dictionary token. Finally, the dictionary size is set equal to the final size variable.

The next section of pseudocode relates to loading the sample dictionary:

```
LOAD_SAMPDICT.
Loop through the list of sample dictionaries
pointed off by SAMPLING_STAT_PTR
from IN.
Set dictionary segment control blocks to
load dictionaries and corresponding sampling
statistics, beginning with numeric dictionaries
and continuing with text dictionaries.
Call BD to build the sampling dictionary.
```

It should be apparent from the pseudocode that the candidate dictionary segments from the interrogation process are added one by one to a data structure by repeatedly calling the BD module 34 (FIG. 3). The BD module simply retrieves the dictionary segments from the system memory according to the identifiers and concatenates one or more of them, depending on the received dictionary token, into a single system-built dictionary for use by the HCF.

Finally, the ANALYZE_SAMPLE pseudocode comprises sorting the dictionary segments by the output compressed length and then taking the exclusive logical sum (XOR) of the top half number of data segment identifiers to form the TOP_HALF value:

ANALYZE SAMPLE.

Sort the DBBs by the output compressed length.

XOR the top half number of DBB identifiers together to form the L_TOP_HALF value.

Figure 8:
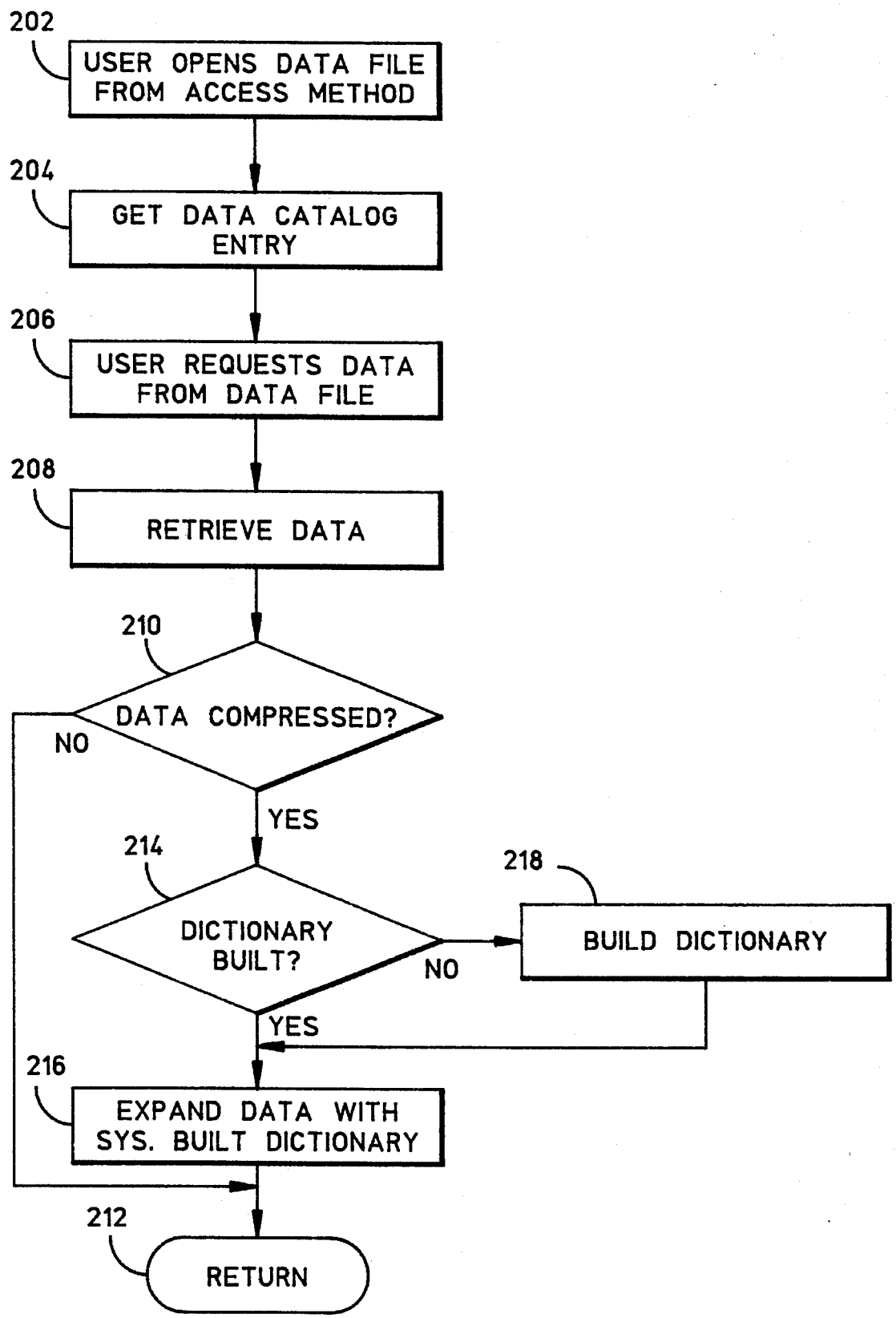
FIG. 8 is a flow diagram representing the processing performed by the interface of FIG. 2.

As noted above, data files may be stored in a compressed format upon being closed, or placed in external storage, and may then be retrieved and decompressed. In the system illustrated in FIG. 2, for example, the access method responds to a user request for storing data created through an application by determining whether the corresponding data is in an open condition, meaning that the data file is currently expanded and available for updating, or is in a closed condition requiring retrieval according to the operating system. FIG. 8 is a flow diagram illustrating the retrieval process.

In the initial step represented in FIG. 8 by the flow diagram box numbered 202, a user opens a data file located in an external storage device using the computer system access method. At the next flow diagram box, numbered 204, the access method examines the data catalog entry associated with every data file maintained by the operating system to determine the data file format and to determine the data file location. After the data file is opened, the next step at the flow diagram box numbered 206 occurs when a user requests a data block from the opened data file. At box 208 the data block is retrieved and at box 210 the system checks to determine if the data block has been compressed. The system can determine this, for example, by checking a compression flag bit or by checking to see if a dictionary token was specified in the data catalog associated with the data file, in which case the lack of a token indicates that the data file was not compressed. If the data file was not compressed, then at box 212 the retrieved data is returned to the requesting user.

If the data was compressed, then at decision box 214 the system determines if the corresponding compression dictionary has been built. That is, whether the system-built dictionary for this block exists in tokenized form or in its built (expanded) form. The processing of box 214 comprises comparing the tokens of system-built dictionaries indicated as having been built. Dictionaries are easily compared because, as noted in the pseudocode above, the dictionary identifiers associated with dictionary segments are sorted into a predetermined order when the system-built dictionaries are tokenized. Therefore, to compare dictionaries, the access method in box 214 simply compares sorted tokens. If two sorted tokens are identical, then the two corresponding dictionaries are identical.

If two data files are associated with two identical dictionaries and the dictionary for one of those files has been built, then at box 216 the other file will use that already built system-built dictionary to return the compressed data to its original, or expanded, form. The expanded data is then returned at box 212. If the dictionary has not been built, but rather is still tokenized, then at box 218 the dictionary is built before it is used to return the compressed data to its expanded form at box 216. Building the dictionary at step 218 comprises examining each of the dictionary identifiers of a system-built dictionary token and, for each identifier, retrieving a copy of the corresponding dictionary segment from among the segments making up the library of dictionary segments available and concatenating the segments with the other similarly retrieved segments. At the flow diagram box numbered 216 the compressed data file is decompressed with the system-built dictionary. The data is then returned to the user at the box numbered 212.

In this way, the user can specify data compression or no compression when creating and storing data and then the system can retrieve data, using an access method interface to determine if the data is in compressed form and, if it is, obtaining the associated compression dictionary and decompressing the data. Thus, the system can operate such that data is compressed as it is created and stored in external storage devices and then is decompressed whenever it is later accessed by a user. In the preferred embodiment, the dictionary is automatically tokenized and stored in the data catalog of a data file to be retrieved later when the data file is opened. The compression dictionary is easily rebuilt from the dictionary library using the token specified in the data catalog.

During operation of the system 10 illustrated in FIG. 2, if desired, either the user 12 or the access method 22 can independently request interrogation and, if necessary, sampling, after the initial selection of the system-built dictionary. This might be desirable, for example, to determine if a change should be made to the system-built dictionary being used for compression. Alternatively, the access method can perform interrogation every time a data file in the external data storage is accessed for adding new data and can compare the resulting system-built dictionary token to the dictionary token specified by the data catalog entry associated with the data file. Whenever interrogation/sampling is to be performed on an already existing data file, the access method can carry out the steps described in the flow diagram of FIG. 4 beginning at box 54. All other processing for the interrogation and sampling is as described above.

In accordance with the system described above, a portion of a data set that is opened and specified for data compression is interrogated so that character occurrence data for the interrogated portion can be used to select specialized dictionary segments from a library of dictionary segments for compressing the data set. Copies of the selected dictionary segments are combined into a system-built dictionary represented by one or more dictionary identifiers that are stored as a token in a data catalog entry associated with the data set. The data set can then be compressed with the system-built dictionary as it is stored in external storage devices. The system-built dictionary can be discarded when the data set is closed. Thereafter, when the data set is opened, the dictionary token can be retrieved from the data set catalog entry and the system-built dictionary can be expanded, or rebuilt, by obtaining from the library the dictionary segments specified by the token identifiers and combining them. The resulting system-built dictionary can then be used to decompress the data and provide the original data set.

The present invention has been described above in terms of a presently preferred embodiment so that an understanding of the present invention can be conveyed. There are, however, many configurations for data compression systems not specifically described herein but with which the present invention is applicable. The present invention should therefore not be seen as limited to the particular embodiment described herein, but rather, it should be understood that the present invention has wide applicability with respect to data compression generally. All modifications, variations, or equivalent arrangements that are within the scope of the attached claims should therefore be considered to be within the scope of the invention.

We claim:

1. A computer-implemented method of forming system-built dictionaries used in the compression of uninterrupted character byte strings in the management of catalog-based data sets comprising records located in external storage, said catalogs containing information identifying the format of each data set and its location in the external storage, each data set assuming a closed status until subject to access commands, and thereupon assuming an open status, the method comprising the steps of:

(a) providing a library of dictionary segments;
    (b) scanning the records during the initial recordation of records to the external storage and collecting characteristic attributes and statistics from the scanning;
    (c) selecting dictionary segments from the library of dictionary segments in accordance with the attributes and statistics; and
    (d) combining the dictionary segments to form a system-built dictionary.

2. A computer-implemented method of forming system-built dictionaries used in the compression of uninterrupted character byte strings in the management of catalog-based data sets comprising records located in external storage, said catalogs containing information identifying the format of each data set and its location in the external storage, each data set assuming a closed status until subject to access commands, and thereupon assuming an open status, the method comprising the steps of:

(a) providing a library of dictionary segments;
    (b) scanning the records during the initial recordation of records to the external storage and collecting characteristic attributes and statistics from the scanning;
    (c) selecting dictionary segments from the library of dictionary segments in accordance with the attributes and statistics;
    (d) combining the dictionary segments to form a system-built dictionary:
    (e) selecting a dictionary token comprising one or more predetermined symbols that represent the system-built dictionary such that the token identifies the selected dictionary segments; and
    (f) storing the dictionary token in the system catalog and discarding the system-built dictionary such that, after the data set is closed, the data set can be opened again, the token can be retrieved from the system catalog, and the corresponding selected dictionary segments it represents can be retrieved from the library of dictionary segments.

3. A method as defined in claim 2, wherein the dictionary token is included as an element of the data set upon the data set being archived or migrated from its external storage location.

4. A computer-implemented method of forming system-built dictionaries used in the compression of uninterrupted character byte strings in the management of catalog-based data sets comprising records located in external storage, said catalogs containing information identifying the format of each data set and its location in the external storage, each data set assuming a closed status until subject to access commands, and thereupon assuming an open status, the method comprising the steps of:

(a) providing a library of dictionary segments;
    (b) scanning the records during the initial recordation of records to the external storage and collecting characteristic attributes and statistics from the scanning;
    (c) selecting dictionary segments from the library of dictionary segments in accordance with the attributes and statistics; and
    (d) combining the dictionary segments to form a system-built dictionary;

wherein the data characteristic statistics include the occurrence frequency of characters found in the scanned records or a raw count of occurrences for each character in the scanned records; and the step of scanning records and collecting statistics comprises the steps of:
        selecting a first record block for scanning and generating a first set of the data characteristic statistics;
        selecting a second record block, different from the first record block, for scanning and generating a second set of the data characteristic statistics;
        comparing like statistics of the first set and second set of data characteristic statistics and storing the second block in an interrogation buffer if the difference between the like statistics is below a predetermined stabilization threshold and otherwise selecting a new first record block and a new second record block for scanning and generating new respective sets of statistics; and
        repeating the steps of selecting and comparing until the difference between the like statistics is below the predetermined stabilization threshold or until the size of the first record block equals a predetermined scanning limit value.

5. A method as defined in claim 4, wherein the data characteristic statistics include an entropy function for the scanned records and the step of comparing includes the steps of:

comparing the entropy function of the second block to a predetermined entropy threshold value;

halting the repetition of the steps of selecting and comparing if the entropy of the second block is below the entropy threshold value; and storing the second record block in the interrogation buffer.

6. A method as defined in claim 5, wherein the size of a new second record block is greater than the size of the previous first record block.

7. A method as defined in claim 5, wherein the data set is indicated as being not suitable for compression if the scanning limit value is reached without satisfying the entropy threshold value.

8. A method as defined in claim 5, wherein each new first record block selected during the repetition of selecting and comparing comprises the combination of the previously selected first and second record blocks.

9. A method as defined in claim 1, wherein the step of providing a library of dictionary segments further comprises providing dictionary segments that are adapted for text compression of characters including alphabetic letters, numerals, and spacing and punctuation characters.

10. A computer-implemented method of forming system-built dictionaries used in the compression of uninterrupted character byte strings in the management of catalog-based data sets comprising records located in external storage, said catalogs containing information identifying the format of each data set and its location in the external storage, each data set assuming a closed status until subject to access commands, and thereupon assuming an open status, the method comprising the steps of:

(a) providing a library of dictionary segments;

(b) scanning the records during the initial recordation of records to the external storage and collecting characteristic attributes and statistics from the scanning;

(c) selecting dictionary segments from the library of dictionary segments in accordance with the attributes and statistics; and (d) combining the dictionary segments to form a system-built dictionary;

wherein the step of providing a library of dictionary segments further comprises providing dictionary segments that are adapted for text compression of characters including alphabetic letters, numerals, and spacing and punctuation characters; and wherein the step of scanning records includes keeping statistics indicating the occurrences of characters in the scanned record block and the step of selecting dictionary segments for the system-built dictionary comprises selecting a dictionary segment adapted for compression of one or more characters in accordance with the statistics for those characters in the scanned record block.

11. A method as defined in claim 10, wherein the step of providing a library of dictionary segments includes providing dictionary segments that are adapted for compression of one or more characters from predetermined character groups and the step of selecting dictionary segments further comprises selecting a dictionary segment for the system-built dictionary if the dictionary segment is adapted for compression of one or more characters from one of the character groups and the occurrences of characters in the scanned record block belonging to the one character group exceeds a predetermined selection character threshold.

12. A method as defined in claim 10, wherein the step of selecting dictionary segments further comprises:

sorting the selected dictionary segments in order of decreased occurrences of the characters for which each dictionary segment is adapted;

discarding the dictionary segment with the lowest character occurrences until the total size of the selected dictionary segments is less than or equal to a predetermined limit size.

13. A method as defined in claim 10, wherein the step of selecting dictionary segments further comprises:

sorting the selected dictionary segments in order of decreased character occurrences for the characters for which each dictionary segment is adapted;

discarding the lowest frequency dictionary segment until the total number of dictionary segments is less than or equal to a predetermined limit number.

14. A method as defined in claim 10, wherein the step of selecting dictionary segments further comprises:

identifying a dictionary segment adapted for compression of one or more predetermined characters as a candidate for selection to the system-built dictionary if the dictionary segment is adapted for text compression of one or more characters and the occurrences of the characters in the scanned record block exceeds a predetermined candidate threshold value;

evaluating the effectiveness of the candidate dictionary segments during a sampling procedure in which a candidate dictionary segment is applied to a sample of the dataset and sampling statistics are collected on the compression performance of the candidate; and selecting candidate dictionary segments in accordance with the sampling statistics.

15. A method as defined in claim 14, wherein the step of selecting dictionary segments further comprises selecting dictionary segments until the total number of dictionary segments is equal to a predetermined limit number.

16. A method as defined in claim 14, wherein the step of selecting dictionary segments further comprises selecting dictionary segments until the total size of the selected dictionary segments is equal to a predetermined size limit.

17. A method as defined in claim 16, wherein the predetermined size limit number is one of a set of predetermined dictionary fixed sizes.

18. A method of forming compression dictionaries in a computer system that includes data sets with corresponding data catalogs that contain information identifying the format of each data set and its location, the data sets containing records of uninterrupted byte strings that will be compressed by the computer system using the compression dictionaries, the method comprising the steps of:

(a) providing a library of dictionary segments that are adapted for use by the computer system to compress the data sets;

(b) scanning one or more records of a data set during an initial recordation of the data set records to one or more external storage devices and generating predetermined data characteristic statistics as a result of the scanning;

(c) selecting dictionary segments from the library of dictionary segments according to the generated data characteristic statistics; and (d) combining the selected dictionary segments to form a system-built dictionary that is used by the computer system to compress the remaining data records of the data set as the data set is recorded to the one or more external storage devices.

19. A method of forming compression dictionaries in a computer system that includes data sets with corresponding data catalogs that contain information identifying the format of each data set and its location, the data sets containing records of uninterrupted byte strings that will be compressed by the computer system using the compression dictionaries, the method comprising the steps of:

(a) providing a library of dictionary segments that are adapted for use by the computer system to compress the data sets;

(b) scanning one or more records of a data set during an initial recordation of the data set records to one or more external storage devices and generating predetermined data characteristic statistics as a result of the scanning;

(c) selecting dictionary segments from the library of dictionary segments according to the generated data characteristic statistics; and (d) combining the selected dictionary segments to form a system-built dictionary that is used by the computer system to compress the remaining data records of the data set as the data set is recorded to the one or more external storage devices, wherein the step of combining further includes representing the selected dictionary segments of the system-built dictionary by tokens and storing the dictionary tokens in the system data catalog entry for the data set from which the system-built dictionary was formed.

20. A method as defined in claim 19, wherein the dictionary token representing the system-built dictionary is automatically stored in the data catalog by the computer system.

21. A method of forming compression dictionaries in a computer system that includes data sets with corresponding data catalogs that contain information identifying the format of each data set and its location, the data sets containing records of uninterrupted byte strings that will be compressed by the computer system using the compression dictionaries, the method comprising the steps of:

(a) providing a library of dictionary segments that are adapted for use by the computer system to compress the data sets;

(b) scanning one or more records of a data set during an initial recordation of the data set records to one or more external storage devices and generating predetermined data characteristic statistics as a result of the scanning;

(c) selecting dictionary segments from the library of dictionary segments according to the generated data characteristic statistics; and (d) combining the selected dictionary segments to form a system-built dictionary that is used by the computer system to compress the remaining data records of the data set as the data set is recorded to the one or more external storage devices, wherein the generated data characteristic statistics include a frequency distribution of characters found in the scanned record, a count of occurrences for each character in the scanned record, and an entropy value for the scanned record; and the step of scanning records comprises:

completing a stabilization procedure comprising repeating the steps of selecting a current first block of the record for scanning and generating a first set of the data characteristic statistics, selecting a current second block of the record, different from the first block, for scanning and generating a second set of data characteristic statistics, comparing like statistics of the first set of data characteristic statistics and the second set of data characteristic statistics, and selecting a new first block and a new second block for scanning and generating new respective sets of data characteristic statistics until the step of comparing indicates that the statistical difference between the first and second sets of statistics is below a predetermined stabilization threshold value, or until the size of the second block equals a predetermined scanning limit value, whereupon the combination of the first block and second block is stored in an interrogation buffer if the entropy value of the second set of statistics is below a predetermined entropy threshold value.

22. A method as defined in claim 21, wherein the generated data characteristic statistics include a data record entropy function and the data record is indicated as being not suitable for compression and the first block is not stored in the interrogation buffer if the scanning limit value is reached without satisfying the predetermined stabilization threshold value and without satisfying a predetermined entropy threshold value.

23. A method as defined in claim 21, wherein the new first block comprises the combination of the current first block and second block.

24. A method as defined in claim 21, wherein each second block comprises the combination of the current first block and the next block of the data set equal in size to the current first block.

25. A method as defined in claim 21, wherein the step of selecting dictionary segments comprises selecting dictionary segments according to a character frequency distribution of the data characteristic statistics.

26. A method as defined in claim 25, wherein the step of selecting dictionary segments comprises selecting a dictionary segment in accordance with the count of occurrences of one or more predetermined characters from the data characteristic statistics.

27. A method as defined in claim 25, wherein the step of selecting dictionary segments comprises selecting a dictionary segment in accordance with the data characteristic statistics count of occurrences of characters in one or more character groups.

28. A method as defined in claim 25, wherein the step of selecting dictionary segments further comprises keeping no more than a predetermined limit number of selected dictionary segments in the system-built dictionary.

29. A method as defined in claim 25, wherein the step of selecting dictionary segments further comprises:

sorting the selected dictionary segments in order of decreasing frequency of character occurrences from the data characteristic statistics;

discarding the lowest frequency dictionary segment until the total size of the selected dictionary segments is less than or equal to a predetermined limit size.

30. A method as defined in claim 29, wherein the predetermined limit size is a selected one of a set of predetermined system-built dictionary fixed sizes.

31. A method as defined in claim 30, wherein the set of predetermined fixed sizes comprises 512, 1K, 2K, 4K, and 8K dictionary entries.

32. A method as defined in claim 25, wherein the step of selecting dictionary segments further comprises:

identifying dictionary segments as candidate segments for a sampling procedure in accordance with the rate of occurrence of one or more predetermined characters in the scanned record.

33. A method as defined in claim 32, wherein:

the system-built dictionary is designated as having one of a set of predetermined dictionary fixed sizes; and the step of selecting dictionary segments further comprising the steps of:

performing the following steps if no candidate segments were identified:

adding the sizes of the selected dictionary segments, ranking the selected dictionary segments by character group probability, removing the lowest ranked dictionary segment; and performing the following step if one or more candidate segments were identified:

adding an identified candidate dictionary segment to the set of selected dictionary segments if the predetermined system-built dictionary fixed size sufficient to contain the selected dictionary segments and the identified candidate segment is equal to the predetermined system-built dictionary fixed size sufficient to contain the selected dictionary segments and if the total number of selected dictionary segments and the number of identified candidate segments is less than or equal to a sampling limit number.

34. A method of forming compression dictionaries in a computer system that includes data sets with corresponding data catalogs that contain information identifying the format of each data set and its location, the data sets containing records of uninterrupted byte strings that will be compressed by the computer system using the compression dictionaries, the method comprising the steps of:

(a) providing a library of dictionary segments that are adapted for use by the computer system to compress the data sets;

(b) scanning one or more records of a data set during an initial recordation of the data set records to one or more external storage devices and generating predetermined data characteristic statistics as a result of the scanning;

(c) selecting dictionary segments from the library of dictionary segments according to the generated data characteristic statistics; and (d) combining the selected dictionary segments to form a system-built dictionary that is used by the computer system to compress the remaining data records of the data set as the data set is recorded to the one or more external storage devices, wherein the step of combining the dictionary segments comprises the steps of:

selecting dictionary identifiers that comprise display code symbols representing each of the selected dictionary segments; and concatenating the dictionary identifiers that represent the selected dictionary segments to form the system-built dictionary token.

35. A method as defined in claim 34, further including the step of storing the dictionary token representing the selected dictionary segments in the system data catalog and discarding the system-built dictionary.

36. A method as defined in claim 35, wherein the step of selecting dictionary identifiers further comprises ordering the dictionary identifiers in order of the display code representation of the dictionary segment.

37. A method as defined in claim 36, wherein the step of selecting further comprises the steps of:

ordering the dictionary identifiers according to the compressed output length and the number of compressed symbols in the compression results;

determining a set of desired system-built dictionary fixed sizes; and discarding particular ones of the dictionary identifiers so as to include in the system-built dictionary only those dictionary identifiers that will represent a system-built dictionary having a size less than or equal to a selected system-built dictionary fixed size.

38. A method as defined in claim 37, wherein the step of discarding identifiers further includes adding identifiers representing padding dictionary segments to the system built dictionary, if the actual number of entries in the dictionary is less than the selected system-built dictionary fixed size, such that the size of the resulting system-built dictionary is equal to the selected fixed size.

39. A method of storing and retrieving data sets in a computer system, the computer system maintaining data catalogs containing information identifying the format of each data set and its storage location in the computer system, the data sets comprising records of uninterrupted byte strings and assuming either a closed status in which the data records cannot be accessed or an open status in which the data records are subject to access commands for retrieval of records, the method comprising the steps of:

(a) providing a library of dictionary segments that are adapted for use by the computer system to create a Ziv-Lempel tree structure for a data compression process;

(b) scanning the records of a data set during an initial recordation of the records to their stored location and generating predetermined data characteristic statistics representative of the scanned records;

(c) selecting dictionary segments from the library of dictionary segments according to the generated data characteristic statistics and compressing the scanned record with the selected dictionary segments to generate compression statistics relating to the scanned record and the data compression outcome;

(d) combining the selected dictionary segments to form a system-built dictionary; and (e) compressing the data set with the data compression process using the system-built dictionary and storing the compressed data set in their stored location.

40. A method as defined in claim 39, further including the steps of:

(f) selecting a sample block from among the blocks of the data set being compressed with the system-built dictionary as the compressed blocks are stored in the computer system;

(g) generating compression statistics relating to the selected sample block data and the data compression outcome;

(h) comparing like compression statistics from the selected sample block and from the scanned record; and (i) indicating that a system-built dictionary rebuild process is desirable if the step of comparing indicates that the difference in the compression statistics between the sample block and the scanned record is greater than a rebuild parameter value.

41. A method of storing and retrieving data sets in a computer system, the computer system maintaining data catalogs containing information identifying the format of each data set and its storage location in the computer system, the data sets comprising records of uninterrupted byte strings and assuming either a closed status in which the data records cannot be accessed or an open status in which the data records are subject to access commands for retrieval of records, the method comprising the steps of:

(a) providing a library of dictionary segments that are adapted for use by the computer system to create a Ziv-Lempel tree structure for a data compression process;

(b) scanning the records of a data set during an initial recordation of the records to their stored location and generating predetermined data characteristic statistics representative of the scanned records;

(c) selecting dictionary segments from the library of dictionary segments according to the generated data characteristic statistics and compressing the scanned record with the selected dictionary segments to generate compression statistics relating to the scanned record and the data compression outcome;

(d) combining the selected dictionary segments to form a system-built dictionary; and (e) compressing the data set with the data compression process using the system-built dictionary and storing the compressed data set in their stored location, wherein the step of providing a library of dictionary segments includes providing text-based dictionary segments adapted for compressing predetermined alphanumeric character sequences.

42. A method as defined in claim 41, wherein the step of providing a library of dictionary segments further comprises providing dictionary segments adapted for compressing mutually exclusive strings of characters.

43. A combination for use in a computer system that receives user requests to compress uninterrupted byte strings of data sets recorded into storage locations of the computer system and that maintains data catalogs containing information identifying the format of each data set and its storage location, the data sets comprising records of data and assuming either a closed status in which the data set cannot be accessed or an open status in which the data set is subject to access commands, the combination comprising:

(a) a library of dictionary segments that are adapted for use by the computer system to create a Ziv-Lempel tree for a data compression process;

(b) an interrogation processor that initiates scanning of a plurality of the data set records during an initial recordation of the records to the storage locations and generates predetermined data characteristic statistics relating to the scanned records for selecting dictionary segments from the library according to the generated data characteristic statistics and combining the selected dictionary segments to form a system-built dictionary.

44. A combination as defined in claim 43, wherein the interrogation processor optionally designates one or more dictionary segments for a sampling process; and the combination further includes:

(c) a sampling processor that retrieves a designated sample data record and compresses the sample record with the dictionary segments designated by the interrogation processor and generates compression statistics relating to the sample data record and the results of the compression.

45. A combination as defined in claim 43, wherein the interrogation processor completes a stabilization procedure by repeatedly performing the steps of selecting a current record block for scanning and generating a current set of the data characteristic statistics, selecting a new record block, different from the current block, for scanning and generating a new set of the data characteristic statistics, and comparing like statistics of the current set of data characteristic statistics and the new set of data characteristic statistics, until the difference between the like statistics is below a predetermined stabilization threshold value or the number of scanned record blocks equals a predetermined scanning limit value, and thereupon storing the new block in an interrogation buffer and storing the set of new data characteristic statistics in the memory if the entropy value is below a predetermined entropy threshold value;

wherein the size of each new record block is greater than the size of the current record block.

46. A combination for use in a computer system that receives user requests to compress uninterrupted byte strings of data sets recorded into storage locations of the computer system and that maintains data catalogs containing information identifying the format of each data set and its storage location, the data sets comprising records of data and assuming either a closed status in which the data set cannot be accessed or an open status in which the data set is subject to access commands, the combination comprising:

(a) a library of dictionary segments that are adapted for use by the computer system to create a Ziv-Lempel tree for a data compression process;

(b) an interrogation processor that initiates scanning of a plurality of the data set records during an initial recordation of the records to the storage locations and generates predetermined data characteristic statistics relating to the scanned records for selecting dictionary segments from the library according to the generated data characteristic statistics and combining the selected dictionary segments to form a system-built dictionary;

wherein the interrogation processor optionally designates one or more dictionary segments for a sampling process; and the combination further includes:

(c) a sampling processor that retrieves a designated sample data record and compresses the sample record with the dictionary segments designated by the interrogation processor and generates compression statistics relating to the sample data record and the results of the compression, and wherein the interrogation processor and the sampling processor designate the selected dictionary segments with identifiers representing the dictionary segments and the combination further comprises:

(d) a dictionary build processor that receives the dictionary identifiers representing the dictionary segments of the system-built dictionary and retrieves the corresponding dictionary segments representing the system-built dictionary from the library of dictionary segments for use by the computer system in creating a Ziv-Lempel tree for reversing the data compression process;

(e) an access method processor that, upon receiving the dictionary identifiers from the compression management processor, stores the dictionary identifiers in the system data catalog entry associated with a data set such that the data set can be closed and retrieves the identifiers upon the data set being opened; and (f) a process router that controls the operation of the combination to initiate operation of either the interrogation processor, the sampling processor, the access method processor, or the dictionary build processor.

47. A combination as defined in claim 46, wherein the data characteristic statistics generated by the interrogation processor include a frequency distribution of characters found in the scanned record, a rate of occurrence for each character in the frequency distribution, and an entropy value; and the interrogation processor further comprises:

means for completing a stabilization procedure comprising repeating the steps of
selecting a current record block for scanning and generating a current set of the data characteristic statistics,
selecting a new record block, different from the current block, for scanning and generating a new set of the data characteristic statistics, and
comparing the current set of statistics to the new set of statistics, until the entropy value of the new set is below a predetermined entropy threshold and the number of scanned record blocks equals a predetermined scanning limit value, and thereupon storing the new block in an interrogation buffer and storing the set of new data characteristic statistics.

48. A combination as defined in claim 47, wherein the interrogation processor indicates the data set as being not suitable for compression if the scanning limit value is reached without satisfying the entropy threshold value.

49. A combination as defined in claim 48, wherein each new record block is twice the size of the prior record block and includes the prior record block.

50. A combination as defined in claim 47, wherein the interrogation processor selects dictionary segments according to a character frequency distribution from the new set of data characteristic statistics for the scanned record block.

51. A combination as defined in claim 50, wherein the interrogation processor selects a dictionary segment in accordance with the rate of occurrence of one or more predetermined characters in the scanned record block.

52. A combination as defined in claim 51, wherein the interrogation processor selects a dictionary segment in accordance with the rate of occurrence of characters in one or more character groups in the scanned record block.

53. A combination as defined in claim 47, wherein the interrogation processor further includes:
means for selecting dictionary segments until the total number of selected dictionary segments is equal to a predetermined limit number.

54. A combination as defined in claim 47, further including:
means for selecting dictionary segments until the total size of the selected dictionary segments is equal to a predetermined size limit.

55. A combination as defined in claim 47, further including:
means for sorting the selected dictionary segments in order of decreasing frequency of character occurrence in the data characteristic statistics; and
means for discarding the lowest frequency dictionary segment until the total size of the selected dictionary segments is less than or equal to a predetermined size limit.

56. A combination as defined in claim 55, wherein the predetermined size limit is a selected one of a set of predetermined dictionary fixed sizes.

57. A combination as defined in claim 56, wherein the set of predetermined fixed sizes comprises 512, 1K, 2K, 4K, and 8K dictionary entries.

58. A combination as defined in claim 56, wherein the means for discarding adds padding dictionary segments to the system-built dictionary, if the actual number of entries of the dictionary is less than the selected fixed size, such that the size of the resulting system-built dictionary is equal to the selected fixed size.

59. A combination as defined in claim 47, wherein the interrogation processor further comprises:

means for identifying dictionary segments as candidate segments for a sampling procedure in accordance with the rate of occurrence of one or more predetermined characters in the scanned record block.

60. A combination as defined in claim 59, wherein the interrogation processor further includes:
means for performing the following steps if no candidate segments were identified:
adding the sizes of the selected dictionary segments,
ranking the selected dictionary segments by group probability,
removing the lowest ranked dictionary segment; and
means for performing the following step if one or more candidate segments were identified:
adding a candidate dictionary segment to the set of selected dictionary segments if one of a set of predetermined dictionary fixed sizes sufficient to contain the selected dictionary segments and the identified candidate segments is equal to the predetermined dictionary fixed size sufficient to contain the selected dictionary segments alone and if the total number of selected dictionary segments and identified candidate segments is less than or equal to a dictionary segment limit number.

61. A combination as defined in claim 60, wherein the dictionary segment limit number is sixteen.

62. A combination as defined in claim 47, wherein the dictionary build processor produces a dictionary token comprising the dictionary identifiers ordered in a sequence in accordance with the display representation of the identifiers of the respective dictionary segments.

63. A combination as defined in claim 62, further including a sampling processor having:
means for determining a desired system-built dictionary size;
means for ordering the dictionary identifiers according to the cumulative compression ratio; and
means for selecting the dictionary segments so as to include in the system-built dictionary only those dictionary segments that will maintain the system-built dictionary size less than or equal to the desired system-built dictionary size.

64. A combination as defined in claim 63, wherein the means for determining a dictionary size selects a size from a set of predetermined dictionary fixed sizes.

65. A combination as defined in claim 63, wherein the set of predetermined fixed sizes comprises 512, 1K, 2K, 4K, and 8K dictionary entries.

66. A combination as defined in claim 47, wherein the interrogation processor further includes:
(b)(1) means for selecting a sample block from the dataset being compressed by the system-built dictionary as the dataset is recorded to the external storage;
(b)(2) means for scanning the selected sample block and applying the system-built dictionary to the sample block and generating data characteristic statistics relating to the sample block data and the data compression outcome; and
(b)(3) means for comparing the statistics from the selected sample with statistics from one of the statistics from the dataset.

67. A combination as defined in claim 66, wherein the interrogation processor further includes:
(b)(4) means for indicating that a system-built dictionary rebuild process is desirable if the comparison indicates that the compression ratio for the sample is less than the compression ratio of the dataset by greater than a rebuild parameter.

68. A combination as defined in claim 47, wherein the dictionary segments include one or more user-defined dictionaries.

69. A combination as defined in claim 68, wherein the user-defined dictionaries comprise text-based dictionaries containing alphanumeric sequences.

70. A computer system comprising:

a central processing unit including a data compression facility and a file access method interface;

one or more users that communicate with the central processing unit;

one or more applications that are controlled by the users and generate uninterrupted byte strings of datasets;

external data storage devices that receive data sets from the file access method interface;

memory containing data catalogs having information identifying the format of each data set and its location in external storage, the data sets comprising records of byte strings and assuming either a closed status in which the data set cannot be accessed or an open status in which the data set is subject to access commands;

a library of dictionary segments that are adapted for use by the central processing unit to create a Ziv-Lempel tree for the data compression facility;

an interrogation processor that initiates scanning the records during an initial recordation of a data set to the external storage and generating predetermined interrogation data characteristic statistics for selecting dictionary segments according to the generated interrogation statistics and either combining the selected dictionary segments to form a system-built dictionary or designating one or more dictionary segments for a sampling process; and a sampling processor that retrieves designated sample byte strings from the records and scans the sample byte strings with the dictionary segments designated by the interrogation processor to generate predetermined sampling statistics.

71. A computer system comprising:

a central processing unit including a data compression facility and a file access method interface;

one or more users that communicate with the central processing unit;

one or more applications that are controlled by the users and generate uninterrupted byte strings of datasets;

external data storage devices that receive data sets from the file access method interface;

memory containing data catalogs having information identifying the format of each data set and its location in external storage, the data sets comprising records of byte strings and assuming either a closed status in which the data set cannot be accessed or an open status in which the data set is subject to access commands;

a library of dictionary segments that are adapted for use by the central processing unit to create a Ziv-Lempel tree for the data compression facility;

an interrogation processor that initiates scanning the records during an initial recordation of a data set to the external storage and generating predetermined interrogation data characteristic statistics for selecting dictionary segments according to the generated interrogation statistics and either combining the selected dictionary segments to form a system-built dictionary or designating one or more dictionary segments for a sampling process; and a sampling processor that retrieves designated sample byte strings from the records and scans the sample byte strings with the dictionary segments designated by the interrogation processor to generate predetermined sampling statistics, wherein the interrogation processor and sampling processor designate the selected dictionary segments with a dictionary identifier representing each dictionary segment and the combination further comprises:

a dictionary build processor that receives the dictionary identifiers representing the dictionary segments of the system-built dictionary and retrieves the corresponding dictionary segments from the library upon the data set being opened to create the system built dictionary for use during future access commands;

an access method processor that stores the dictionary identifiers in the system data catalog upon the data set being closed and retrieves the identifiers upon the data set being opened; and a process router that controls the operation of the combination to initiate operation of either the interrogation processor, the sampling processor, the access method processor, or the dictionary build processor.

72. A system as defined in claim 71, wherein the interrogation data characteristic statistics generated by the interrogation processor include a frequency distribution of characters found in the scanned record, a rate of occurrence for each character in the frequency distribution, and an entropy value of the scanned record; and the interrogation processor further comprises:

means for completing a stabilization procedure comprising repeating the steps of selecting a current record block for scanning and generating a current set of the interrogation statistics, selecting a new record block, different from the current block, for scanning and generating a new set of the interrogation statistics, and comparing like statistics of the current set of statistics and the new set of statistics, until the difference between the like statistics is below a predetermined stabilization threshold value or the number of scanned record blocks equals a predetermined scanning limit value, and thereupon storing the new block in an interrogation buffer and storing the set of new interrogation statistics in the memory if the entropy value is below a predetermined entropy threshold value.

73. A system as defined in claim 72, wherein the interrogation processor indicates the data set as being not suitable for compression if the scanning limit value is reached without satisfying the entropy threshold value.

74. A system as defined in claim 72, wherein the size of each new record block is greater than the size of the current record block.

75. A combination as defined in claim 74, wherein each new record block comprises the combination of the current record block and the next block of the data set equal in size to the current record block.

76. A system as defined in claim 72, wherein the interrogation processor selects dictionary segments according to a character frequency distribution from the new set of interrogation statistics for the scanned record block.

77. A system as defined in claim 76, wherein the interrogation processor selects a dictionary segment in accordance with the rate of occurrence of one or more predetermined characters in the scanned record block.

78. A system as defined in claim 77, wherein the interrogation processor selects a dictionary segment in accordance with the rate of occurrence of characters in one or more character groups in the scanned record block.

79. A system as defined in claim 72, further including:
means for selecting dictionary segments until the total number of dictionary segments selected for the system-built dictionary is equal to a predetermined limit number.

80. A system as defined in claim 72, further including:
means for sorting the selected dictionary segments in order of decreasing frequency of occurrence; and
means for discarding the lowest frequency dictionary segment until the total size of the selected dictionary segments is less than or equal to a predetermined size limit.

81. A system as defined in claim 80, wherein the predetermined size limit selected by the means for discarding is one of a set of predetermined dictionary fixed sizes.

82. A system as defined in claim 81, wherein the set of predetermined fixed sizes comprises 512, 1K, 2K, 4K, and 8K dictionary entries.

83. A system as defined in claim 82, wherein the means for discarding adds padding dictionary segments to the system-built dictionary, if the actual number of entries of the dictionary is less than the selected fixed size, such that the size of the resulting system-built dictionary is equal to the selected fixed size.

84. A system as defined in claim 72, wherein the interrogation processor further comprises:
means for identifying dictionary segments as candidate segments for a sampling procedure in accordance with the rate of occurrence of one or more predetermined characters in the scanned record block.

85. A system as defined in claim 83, wherein the interrogation processor further includes:
means for performing the following steps if no candidate segments were selected:
adding the sizes of the selected dictionary segments,
ranking the selected dictionary segments by group probability,
removing the lowest ranked dictionary segment; and
means for performing the following step if one or more candidate segments were identified:
adding a candidate dictionary segment to the set of selected dictionary segments if one of a set of predetermined dictionary fixed sizes sufficient to contain the selected dictionary segments and the candidate segments is equal to the predetermined dictionary fixed size sufficient to contain the selected dictionary segments alone and if the total number of selected dictionary segments and candidate segments is less than or equal to a dictionary segment limit number.

86. A system as defined in claim 72, wherein the dictionary build processor produces a dictionary token comprising the dictionary identifiers ordered in a sequence in accordance with the display representation of the identifiers of the respective dictionary segments.

87. A system as defined in claim 86, wherein the dictionary build processor further includes:
means for determining a desired system-built dictionary size;
means for ordering the dictionary identifiers according to the cumulative compression ratio; and
means for selecting the dictionary segments so as to include in the system-built dictionary only those dictionary segments that will maintain the system-built dictionary size less than or equal to the desired system-built dictionary size.

88. A system as defined in claim 87, wherein the means for determining a dictionary size selects a size from a set of predetermined dictionary fixed sizes.

89. A system as defined in claim 88, wherein the set of predetermined fixed sizes comprises 512, 1K, 2K, 4K, and 8K dictionary entries.

* * * * *